(12) United States Patent  (10) Patent No.: US 6,532,187 B2
Fujimoto et al.  (45) Date of Patent: Mar. 11, 2003

(54) SEMICONDUCTOR DEVICE HAVING INTEGRATED MEMORY AND LOGIC

(75) Inventors: Tomonori Fujimoto, Neyagawa (JP); Shoji Sakamoto, Kyoto (JP); Kiyoto Ohta, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/867,547

(22) Filed: May 31, 2001

(65) Prior Publication Data

US 2001/0048630 A1 Dec. 6, 2001

(30) Foreign Application Priority Data

May 31, 2000 (JP) ........................................ 2000-161316

(51) Int. Cl.[7] ................................................. G11C 8/00
(52) U.S. Cl. ................ 365/233; 365/230.06; 365/238.5
(58) Field of Search ........................... 365/233, 230.06, 365/230.08, 201, 230.03, 238.5

(56) References Cited

U.S. PATENT DOCUMENTS 4,928,265 A * 5/1990 Higuchi et al. ........ 365/189.01
5,521,879 A * 5/1996 Takasugi ..................... 365/233
6,115,314 A * 9/2000 Wright et al. ................ 365/233
6,192,003 B1 2/2001 Ohta et al. ................... 365/233

* cited by examiner

Primary Examiner—Son Mai
(74) Attorney, Agent, or Firm—Parkhurst & Wendel, L.L.P.

(57) ABSTRACT

In a conventional DRAM, row addresses and column addresses are latched by DFF and decoding of addresses is started a certain time after a clock rise, and it takes a long time after the clock rise until the decoding is completed, having a problem that it is not possible to perform read/write at high speed. The present invention adopts a configuration connecting latch circuits such as the row address latch circuits and column address latch circuits using a scan chain. This makes decoding of row addresses and column addresses start when the clock is "L", making it possible to complete decoding on the rise of each operation clock cycle, shorten the operation clock cycle and speed up read/write. The conventional art conducts a test on the connection between the row addresses and column addresses of the logic section and memory through an actual operation test of the entire LSI, resulting in a low circuit failure detection rate. The present invention conducts this test through a scan test, making it possible to automatically create test patterns with high circuit failure detection rate.

11 Claims, 17 Drawing Sheets

SEMICONDUCTOR DEVICE HAVING INTEGRATED MEMORY AND LOGIC

FIELD OF THE INVENTION

The present invention relates to a semiconductor apparatus (including a microcomputer) with a memory and logic circuit integrated into a single chip.

BACKGROUND OF THE INVENTION

A conventional dynamic RAM 1000 is constructed as shown in FIG. 16 and operates according to a timing chart shown in FIG. 17. More specifically, time t0 to t3 indicates a read cycle and time t3 to t6 indicates a write cycle.

First, the operation of the read cycle of time t0 to t3 will be explained. In the following explanations, a signal that becomes active at an "L" level or an inverted signal is expressed with "/" prefixed to the signal name.

Since a /row enable signal (row enable signal that becomes active at an "L" level) is "L" on the rising edge of a time t0 clock signal, a row address R0 is latched and output by a D type flip flop (hereinafter referred to as "DFF") of a row address latch circuit 1002. A row decoder 1004 starts decoding at a point in time when R0 is output as the latch data of the above described row address, reads data of a memory cell connected to a word line (hereinafter referred to as "WL") selected by the decoding result to a bit line or /bit line and amplifies the data using 1024 sense amplifiers.

At time t1, a /row selection control signal is "L" and a /column selection control signal is "L", and therefore a /column enable signal is driven "L" and a column address C0 is latched and output by a DFF of a column address latch circuit 1001 on the rising edge of the clock signal.

Decoding starts at a point in time when C0 is output as the latch data of the above described column address, one of four column selection signals (3:0) is enabled, 256 bit lines and /bit lines are selected from among the bit lines and /bit lines amplified by the above described 1024 sense amplifiers, amplified by a main amplifier and output to data outputs (255:0). Next, the operation of the write cycle of time t3 to t6 will be explained.

At time t3, the same operation as that at time t0 is performed, one of WL (255:0) is selected by R1 to carry out the same operation as that at time t0, connected to a bit line and /bit line selected by a column address C1 and data of data inputs (255:0) is written in memory cells whose WL is enabled.

DISCLOSURE OF THE INVENTION

However, in the conventional configuration, row addresses and column addresses are latched by DFF, decoding of an address is started a certain time after the clock for confirming the DFF address has risen, which lengthens the time after the clock rise until WL is selected and the time after the clock rise until column selection signals (3:0) are decoded, and lengthens clock cycles of times t0, t1, t3 and t4 necessary for operation, producing a problem that it is not possible to perform read/write at high speed.

It is an object of the present invention to provide a semiconductor apparatus capable of performing read/write at high speed.

To attain this object, a semiconductor apparatus according to a first aspect of the present invention provides a semiconductor apparatus with a memory and logic section integrated into a single chip, characterized in that the logic section outputs m row addresses from 1st to mth addresses and n column addresses from 1st to. nth addresses to the memory, the memory is constructed of a memory cell array block provided with an input/output section to/from the logic section and a plurality of memory cells, a latch circuit connected to the logic of the input/output section is connected by a scan chain to perform a scan test to test the connection of the logic section, the input/output section is provided with a row address input section and a column address input section, the row address input section is constructed of m latch circuits from 1st to mth row latch circuits, the column address input section is constructed of n latch circuits from 1st to nth column latch circuits, and in the kth (k: integer $1 \leq k \leq m$) row latch circuit, a clock is input to a clock input (CK input), the 1st latch enable signal (1st/latch enable signal) output from the above described memory cell array block is input to an enable signal input (/EN input), the kth row address is input to a data input (D input), an output Q (Q output) is connected to the above described memory cell array block, a shift signal of the above described scan chain data during a scan test is input to a test control signal input (NT input), shift data in a preceding stage of the above described scan chain is input to a test input (DT input), a shift signal to a subsequent stage of the above described scan chain is output to a test output QT (QT output), and in the above described pth (p: integer $1 \leq p \leq n$) column latch circuit, a clock is input to a clock input (CK input), the 2nd latch enable signal (2nd /latch enable signal) output from the above described memory cell array block is input to an enable signal input (/EN input), the (p-m)th column address is input to a data input (D input), an output Q (Q output) is connected to the above described memory cell array block, a shift signal of the scan chain data during a scan test is input to a test control signal input (NT input), shift data in the preceding stage of the above described scan chain is input to a test input (DT input) and a shift signal to the subsequent stage of the above described scan chain is output to a test output QT (QT output).

The latch circuit according to a second aspect of the present invention is constructed of three inputs; a clock input (CK input), an enable signal input (/EN input) and a data input (D input), and an output Q (Q output), a data input circuit and a data holding circuit, characterized in that the above described data input circuit is fed the above described clock input (CK input), enable signal input (/EN input) and the above described data input (D input) and outputs (DQ3), and when the above described enable signal input (/EN input) is active ("L") and the above described clock input (CK input) is at the 1st logic level, outputs the inverted level of the above described data input (D input) to the above described (DQ3), and when the above described enable signal input (/EN input) is non-active ("H") or when the above described clock input (CK input) is at the 2nd logic level, holds (DQ3) at high impedance, the above described data holding circuit is constructed of an inverter that is fed (A1) and outputs the above described (Q output) and an output control circuit, the above described (A1) is connected to (DQ3), the above described output control circuit has three inputs; the above described output Q (Q output), the above described clock input (CK input) and the above described enable signal input (/EN input), and an output (DO1) input to the above described (A1), and when the above described enable signal input (/EN input) is non-active ("H") or the above described clock input (CK input) is at the 2nd logic level, outputs the inverted level of the above described output Q (Q output) to the above described (DO1), and when the above described enable signal input (/EN input) is active ("L") and the above described clock input (CK input) is at the 1st logic level, holds the above described (DO1) at high impedance.

The latch circuit according to a third aspect of the present invention is a latch circuit provided with a data input circuit and a data holding circuit, characterized in that the above described data input circuit has three Pch transistors connected in series; a Pch transistor whose gate is connected to an enable signal input (/EN input), a Pch transistor whose gate is connected to a data input (D input) and a Pch transistor whose gate is connected to a clock input (CK input), with one end of the above described Pch transistors connected in series connected to a power supply and the other end connected to the input (A1) of the above described data holding circuit, and has three Nch transistors connected in series; an Nch transistor whose gate is connected to (EN) which is an inverted signal of the above described enable signal input (/EN input), an Nch transistor whose gate is connected to a data input (D input) and an Nch transistor whose gate is connected to (/CK) which is an inverted signal of the above described clock input (CK input), with one end of the above described Nch transistors connected in series connected to a reference potential GND and the other end connected to the above described (A1), and the above described data holding circuit is connected to an inverter that is fed the above described (A1) and outputs an output Q (Q output) and a 4th Pch transistor whose gate is connected to an inverted signal (EN) of the above described enable signal input and a 5th Pch transistor whose gate is connected to an inverted signal (/CK) of the above described clock input are connected in parallel, the above described two Pch transistors connected in parallel and a 6th Pch transistor whose gate is connected to the above described output Q are connected in series, with one end of the above described serial connection connected to a power supply and the other end connected to the above described (A1), the 4th Nch transistor whose gate is connected to the above described enable signal input (/EN input) and the 5th Nch transistor whose gate is connected to the above described clock input (CK input) are connected in parallel, the above described two Nch transistors connected in parallel and the 6th Nch transistor whose gate is connected to the above described output Q are connected in series, with one end of the above described serial connection connected to the reference potential GND and the other end connected to the above described (A1).

The latch circuit according to a fourth aspect of the present invention is constructed of five inputs of clock input (CK input), enable signal input (/EN input), test control data input (NT), data input (D input) and test input (DT), and two outputs; an output Q and a test output (QT), 1st latch means, 2nd latch means and 3rd latch means, characterized in that the above described 1st latch means is constructed of a 1st data input circuit and a 1st data holding circuit, the above described 1st data input circuit is fed the above described clock input (CK input), the above described enable signal input (/EN input) and the above described data input (D input) and outputs (DQ1) and when the above described enable signal input (/EN input) is active ("L") and the above described clock input (CK input) is at the 1st logic level, outputs the inverted level of the above described data input (D input) to the above described (DQ1) and when the above described enable signal input (/EN input) is non-active ("E") or the above described clock input (CK input) is at the 2nd logic level, holds (DQ1) at high impedance, the above described 1st data holding circuit is constructed of an inverter that is fed (A1) and outputs the above described output Q (Q output) and a 1st output control circuit, the above described (A1) is connected to the above described (DQ3), the above described 1st output control circuit has three inputs; the above described output Q (Q output), the above described clock input (CK input) and the above described enable signal input (/EN input), and an output (DO1) input to the above described (A1) and when the above described enable signal input (/EN input) is nonactive ("H") or the above described clock input (CK input) is at the 2nd logic level, outputs the inverted level of the above described output Q to the above described (DO1) and when the above described enable signal input (/EN input) is active ("L") and the above described clock input (CK input) is at the 1st logic level, holds the above described (DO1) at high impedance, the above described 2nd latch means is constructed of a 2nd data input circuit and a 2nd data holding circuit, has two inputs; a 2nd data input (D2 input) and a 2nd clock input (CK2), and an output (DQ2), and when the above described 2nd clock input (CK2) is at the 1st logic level, outputs the inverted level of the above described 2nd data input (D2 input) to the above described output (DQ2) and when the above described 2nd clock input (CK2) is at the 2nd logic level, holds the above described (DQ2) at high impedance, the above described 2nd data holding circuit is constructed of an inverter that is fed (A2) and outputs above described 2nd output Q2 (Q2), fed the above described (A2) and outputs the above described 2nd output Q2 (Q2) and a 2nd output control circuit, the above described (A2) is connected to the above described (DQ2), the above described 2nd output control circuit has two inputs; the above described 2nd output Q2 (Q2) and the above described 2nd clock input (CK2), and an output (DO2) input to the above described (A2), and when the above described 2nd clock input (CK2) is at the 2nd logic level, outputs the inverted level of the above described 2nd output Q2 (Q2) to the above described (DO2), and when the above described 2nd clock input (CK2) is at the 1st logic level, holds the above described 2nd output Q2 (Q2) at high impedance, the above described 2nd data input (D2 input) is connected to the above described test input (DT) and the above described 2nd clock input (CK2) is connected to the above described clock input (CK input), the above described 3rd latch means is constructed of a 3rd data input circuit and a 3rd data holding circuit, the above described 3rd data input circuit has three inputs; (B3) to which the above described output Q (Q output) is input, (C3) to which the above described 2nd output Q2 (Q2) is input and the above described test control data input (NT) and the above described clock input (CK input), and a 3rd output Q3 (DQ3), and when the above described clock input (CK input) is at the 2nd logic level and the above described test control data input (NT) is non-active ("L"), outputs the inverted level of the above described output Q (Q output) to the above described (DQ3), and when the above described test control data input (NT) is active ("H"), outputs the inverted level of the above described 2nd output Q2 (Q2) to the above described (DQ3), and when the above described clock input (CK input) is at the 1st logic level, holds the above described (DQ3) at high impedance, the above described 3rd data holding circuit is fed (A3) and outputs a 3rd output Q3 (Q3) and is constructed of an inverter that is fed the above described (A3) and outputs the above described 3rd output Q3 (Q3), and a 3rd output control circuit, the above described (A3) is connected to the above described (DQ3), the above described 3rd output control circuit has two inputs; the above described 3rd output Q3 (Q3) and the above described clock input (CK input), and an output (DO3) input to the above described (A3), and when the above described clock input (CK input) is at the 1st logic level, outputs the inverted level of the above described 3rd output Q3 (Q3) to the above described (DO3), and when the above described clock input (CK input) is at the 2nd logic level, holds the above described 3rd output Q3 (Q3) at high impedance, and the above described 3rd output Q3 (Q3) is connected to the above described test output (QT).

The semiconductor apparatus according to a fifth aspect of the present invention is characterized in that in the semiconductor apparatus according to a first aspect, the row latch circuit and column latch circuit are constructed of the latch circuit according to a fourth aspect.

The latch circuit according to a sixth aspect of the present invention is a latch circuit constructed of five inputs of clock input (CK input), enable signal input (/EN input), test control data input (NT), data input (D input) and test input (DT), and two outputs; an output Q and a test output (QT), 4th latch means and 5th latch means, characterized in that the above described 4th latch means is constructed of a 4th data input circuit and a 4th data holding circuit, the above described 4th data input circuit is fed the above described clock input (CK input), the above described enable signal input (/EN input) and the above described test control data input (NT) and the above described data input (D input) and outputs (DQ4) and when the above described test control data input (NT) is non-active ("H"), the above described enable signal input (/EN input) is active ("L") and the above described clock input (CK input) is at the 1st logic level, outputs the inverted level of the above described data input (D input) to the above described (DQ4) and when the above described test control data input (NT) is active ("H") and the above described clock input (CK input) is at the 1st logic level, outputs the inverted level of the above described (DT) to the above described (DQ4), and when the above described test control data input (NT) is non-active ("L") and the above described enable signal input (/EN input) is nonactive ("H") or the above described clock input (CK input) is at the 2nd logic level, holds (DQ4) at high impedance, the above described 4th data holding circuit is constructed of an inverter that is fed (A4) and outputs the above described output Q and a 4th output control circuit, the above described (A4) is connected to the above described (DQ4), the above described 4th output control circuit has four inputs of the above described output Q (Q output), the above described clock input (CK input) and the above described enable signal input (/EN input) and the above described test control data input (NT), and an output (DO4) input to the above described (A4) and when the above described test control data input (NT) is non-active ("L") and the above described enable signal input (/EN input) is non-active ("H") or the above described clock input (CK input) is at the 2nd logic level, outputs the inverted level of the above described output Q (Q output) to the above described (DO4) and when the above described test control data input (NT) is active ("AH") or the above described enable signal input (/EN input) is active ("L") and the above described clock input (CK input) is at the 1st logic level, holds the above described (DO4) at high impedance, the above described 5th latch means is constructed of a 5th data input circuit and the 3rd data holding circuit according to a fourth aspect, the above described 5th data input circuit has two inputs; a 5th data input (D5) and a 5th clock input (CK5), and an output (DQ5), and when the above described 5th clock input (CK5) is at the 2nd logic level, outputs the inverted level of the above described (D5) to the above described (DQ5) and when the above described 5th clock input (CK5) is at the 2nd logic level, holds the above described (DQS) at high impedance, the above described (DQ5) is connected to the above described (A3) of the above described 3rd data holding circuit, and the above described 5th data input (D5) is connected to the above described output Q, the above described 5th clock input (CK5) is connected to the above described clock input (CK input), and the above described (DQ5) is connected to the above described test output (QT).

The latch circuit according to a seventh aspect of the present invention is constructed of the two 2nd latch means according to a fourth aspect and the 3rd latch means according to a fourth aspect, characterized in that the 1st (D2) of the above described 2nd latch means is connected to the data input (D input) and the above described 2nd output Q2 (Q2 output) is connected to the above described output Q (Q output) and the above described (C3) of the above described 3rd latch means and the above described 2nd (D2) of the 2nd latch means is connected to the above described test input (DT) and the above described 2nd output Q2 (Q2) is connected to the above described (B3) of the above described 3rd latch means and the above described 3rd output Q3 (Q3) of the above described 3rd latch means is connected to the above described (QT).

The latch circuit according to an eighth aspect of the present invention is constructed of 6th latch means and the 5th latch means according to a sixth aspect, characterized in that the above described 6th latch means is constructed of a 6th data input circuit and the 2nd data holding circuit according to a fourth aspect, the above described 6th data input circuit is fed the above described clock input (CK input), the above described test control data input (NT) and the above described data input (D input) and outputs (DQ6), and when the above described test control data input (NT) is non-active ("L") and when the above described clock input (CK input) is at the 1st logic level, outputs the inverted level of the above described data input (D input) to the above described (DQ6) and when the above described test control data input (NT) is active ("H") and when the above described clock input (CK input) is at the 1st logic level, outputs the inverted level of the above described test input (DT) to the above described (DQ6), and when the above described clock input (CK input) is at the 2nd logic level, holds (DQ6) at high impedance, the above described (A2) of the above described 2nd data holding circuit is connected to the above described (DQ6), the above described 2nd output Q2 (Q2) is connected to the above described output Q (Q output) and the 5th data input (D5 input) of the above described 5th latch means is connected to the above described output Q (Q output).

The latch circuit according to a ninth aspect of the present invention is characterized in that in the latch circuit according to a fourth aspect, the test output (QT) is fixed to "L" or "H" when the test control data input (NT) is non-active ("L").

The latch circuit according to a tenth aspect of the present invention is characterized in that in the latch circuit according to a sixth aspect, the test output (QT) is fixed to "L" or "H" when the test control data input (NT) is non-active ("L").

The latch circuit according to an eleventh aspect of the present invention is characterized in that in the latch circuit according to a seventh aspect, the test output (QT) is fixed to "L" or "H" when the test control data input (NT) is non-active ("L").

The latch circuit according to a twelfth aspect of the present invention is characterized in that in the latch circuit according to an eighth aspect, the test output (QT) is fixed to "L" or "H" when the test control data input (NT) is non-active ("L").

The semiconductor apparatus according to a thirteenth aspect of the present invention is characterized in that in the semiconductor apparatus according to a first aspect, the kth (k: integer $1 \leq k \leq m$) row latch circuit and the pth (p: integer $1 \leq p \leq n$) column latch circuit are constructed of the latch circuit according to a sixth aspect.

The semiconductor apparatus according to a fourteenth aspect of the present invention is characterized in that in the semiconductor apparatus according to a first aspect, the kth (k: integer $1 \leq k \leq m$) row latch circuit and the pth (p: integer $1 \leq p \leq n$) column latch circuit are constructed of the latch circuit according to ninth aspect.

The semiconductor apparatus according to a fifteenth aspect of the present invention is characterized in that in the semiconductor apparatus according to a first aspect, the kth (k: integer $1 \leq k \leq m$) row latch circuit and the pth (p: integer $1 \leq p \leq n$) column latch circuit are constructed of the latch circuit according to a tenth aspect.

The semiconductor apparatus according to a sixteenth aspect of the present invention is characterized in that in the semiconductor apparatus according to a first aspect, the (DT input) of the kth (k: integer $1 \leq k \leq m$) row latch circuit or the pth (p: integer $1 \leq p \leq n$) column latch circuit is fixed to "L" or "H" when the test control data input (NT) is non-active ("L").

The semiconductor apparatus according to a seventeenth aspect of the present invention is characterized in that in the semiconductor apparatus according to a first aspect, the test input (DT input) of the above described row latch circuit and the above described column latch circuit which is not connected to the test output (QT) of the kth (k: integer $1 \leq k \leq m$) row latch circuit or the pth (p: integer $1 \leq p \leq n$) column latch circuit is fixed to "L" or "H" when the test control data input (NT) is non-active ("L").

The DRAM according to an eighteenth aspect of the present invention is characterized by comprising a plurality of memory cells, a plurality of bits line pairs connected to their respective sense amplifiers, an internal row selection control signal generation circuit that generates an internal row selection control signal synchronized with a clock input based on a row selection control signal input, a row address latch enable signal generation circuit that generates a row address latch enable signal, which is activated when the above described internal row selection control signal is non-active and inactivated when the above described internal row selection control signal is activated, a row address latch circuit that directly outputs a row address supplied from the outside when the above described row address latch enable signal is active and holds the row address internally when the above described row address latch enable signal is non-active, a row address decoder that receives the output of the above described row address latch circuit and operates even if the above described internal row selection control signal is non-active, and a sense amplifier activation signal generation circuit that generates a sense amplifier activation signal that activates the above described sense amplifier in response to the above described internal row selection control signal.

The DRAM according to a nineteenth aspect of the present invention is characterized in that in the DRAM according to an eighteenth aspect, the above described row address latch enable signal generation circuit holds the non-active state of the above described row address latch enable signal until the above described sense amplifier activation signal is inactivated.

The DRAM according to a twentieth aspect of the present invention is characterized in that in the DRAM according to an eighteenth aspect, the above described row address latch circuit operates in synchronization with the above described clock input and directly outputs the row address supplied from the outside only when the above described address latch enable signal is active and the above described clock input is at a predetermined logic level.

The DRAM according to a twenty-first aspect of the present invention comprises q bit lines, /bit lines and r main bit lines, /main bit lines to which a plurality of memory cells and sense amplifiers are connected, a 1st transistor, to the gate connecting the above described bit lines and main bit lines of which a connection control signal is input, a 2nd transistor, to the gate connecting the above described /bit lines and /main bit lines of which a connection control signal is input, a main amplifier that amplifies a potential difference between the above described main bit lines and /main bit lines, a latch circuit to latch the output of the above described main amplifier, and a timing generation circuit that generates a latch signal of the above described latch circuit, the above described connection control signal and /2nd latch enable signal of the above described column address latch circuit, a certain time after the clock edge of the clock cycle for carrying out a read operation of the above described memory cell, characterized in that the above described /2nd latch enable signal is driven "L" when the above described latch circuit completes the input of the output of the above described main amplifier and at timing at which the level of the above described latch signal becomes the level for holding data or at timing at which the above described connection control signal changes from the level for turning ON the above described 1st transistor and 2nd transistor to the level for turning OFF the above described 1st transistor and 2nd transistor, whichever is later, and is driven "H" in synchronization with the clock edge of the clock cycle for carrying out the next read or write operation. The above described column address latch circuit is characterized by directly outputting the input column address when the /2nd latch enable signal is "L" and the above described clock is at the 1st logic level and holds the output signal without inputting the above described column address when the /2nd latch enable signal is "H" or the above described clock is at the 2nd logic level.

The DRAM according to a twenty-second aspect of the present invention comprises q bit lines and /bit lines to which a plurality of memory cells and sense amplifiers are connected, r main bit lines and /main bit lines to which a write buffer outputs write data and /write data during an operation of writing to the above described memory cell, a 1st transistor, to the gate connecting the above described bit lines and main bit lines of which a connection control signal is input, a 2nd transistor, to the gate connecting the above described /bit lines and /main bit lines of which a connection control signal is input, a column address latch circuit and a timing generation circuit that detects the above described clock edge by receiving a clock as input and generates the above described connection control signal and the /2nd latch enable signal of the above described column address latch circuit, characterized in that the /2nd latch enable signal is driven "L" when the above described connection control signal changes from the level for turning ON the above described 1st transistor and 2nd transistor to the level for turning OFF the above described 1st transistor and 2nd transistor in the clock cycle of performing an operation of writing to the above described memory cell, and is driven "H" in synchronization with the clock edge of the clock cycle for carrying out the next read or write operation and the above described column address latch circuit directly outputs the column address input when the above described /2nd latch enable signal is "L" and the above described clock is at the 1st logic level and when the above described /2nd latch enable signal is nonactive ("H") or when the above described clock is at the 2nd logic level, holds the output signal without inputting the above described column address.

The semiconductor apparatus according to a twenty-third aspect of the present invention is characterized in that in the semiconductor apparatus according to any one of a first, thirteenth, fourteenth, fifteenth, sixteenth and seventeenth aspect, the 1st /latch enable signal is a signal that is driven "L" when the above described sense amplifier activation signal according to an eighteenth aspect is at the level of inactivating the above described sense amplifier and the above described internal row selection control signal is at "L" and the 2nd /latch enable signal is driven "L" at the timing according to a sixteenth aspect in the clock cycle of read operation and is driven "L" at the timing according to a seventeenth aspect in the clock cycle of the write operation and is driven "H" in synchronization with the clock edge of the clock cycle that performs a read or write operation.

DESCRIPTION OF THE EMBODIMENTS

With reference now to FIG. 1 to FIG. 15, an embodiment of the present invention will be explained below.

Figure 1:
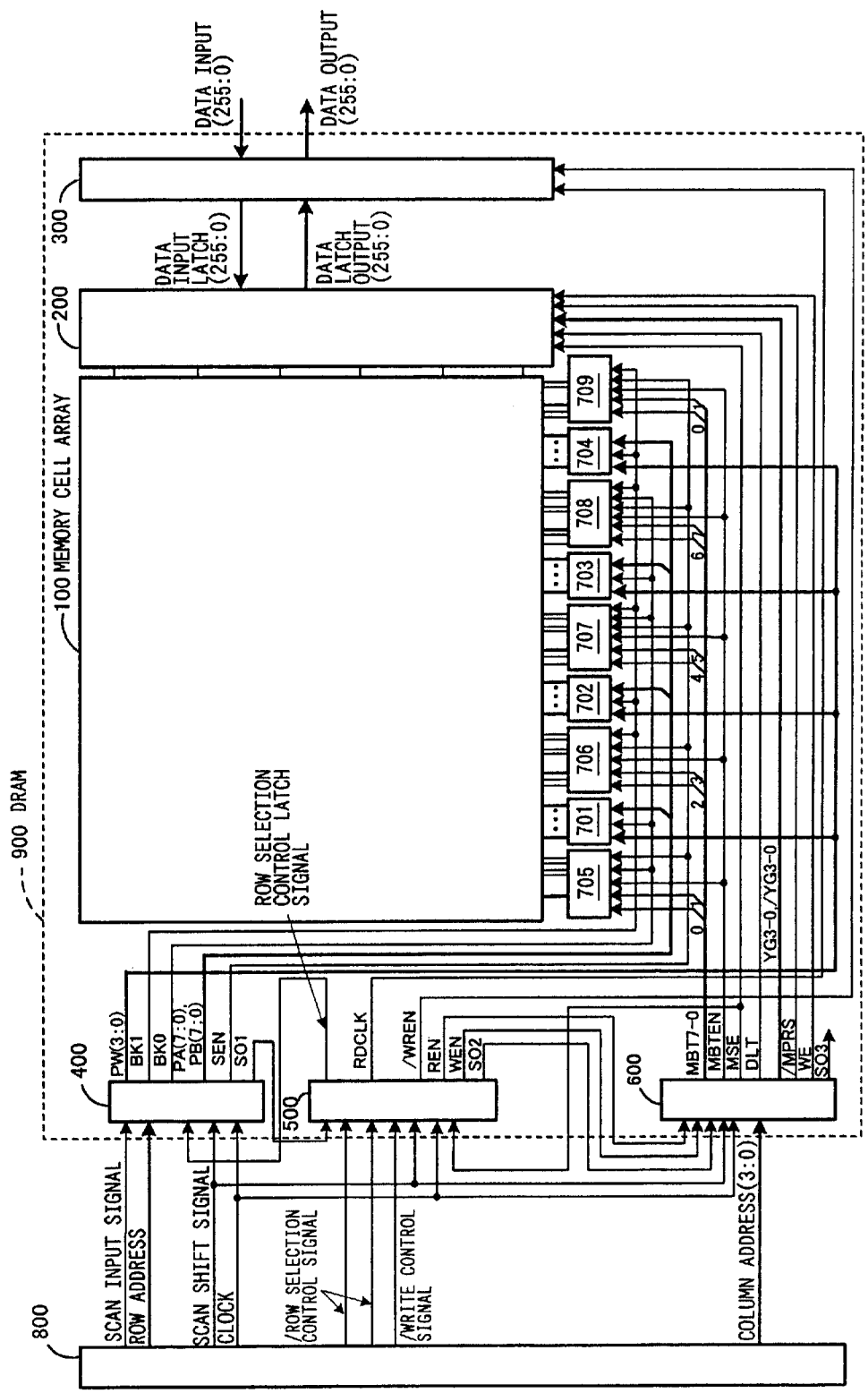
FIG. 1 is a configuration diagram of a semiconductor apparatus according to the present invention.
Figure 2:
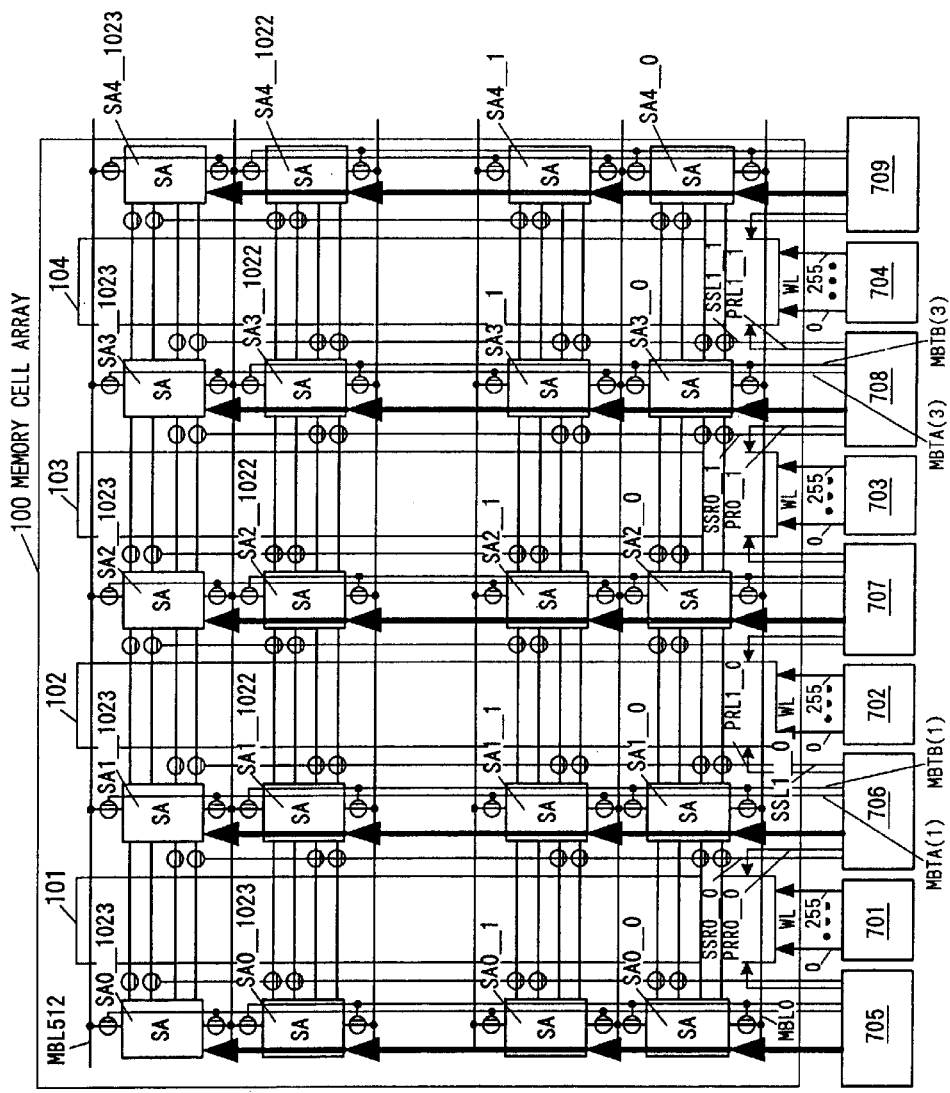
FIG. 2 is a configuration diagram of the memory cell array in FIG. 1.

FIG. 1 shows a semiconductor apparatus with a DRAM 900 as memory and a logic section 800 integrated into a single chip. FIG. 2 shows the memory cell array in FIG. 1.

The logic section 800 outputs m row addresses from 1st to mth row addresses and n column addresses from 1st to nth column addresses to the DRAM 900. The DRAM 900 has a bit width of 256 bits and a memory capacity of 2M bits, for example, and is constructed of a row pre-decoder 400 as an input/output section to/from the above described logic section 800, a control circuit 500, a column selection control circuit 600 and a memory cell array 100 provided with a plurality of memory cells, etc.

Figure 4:
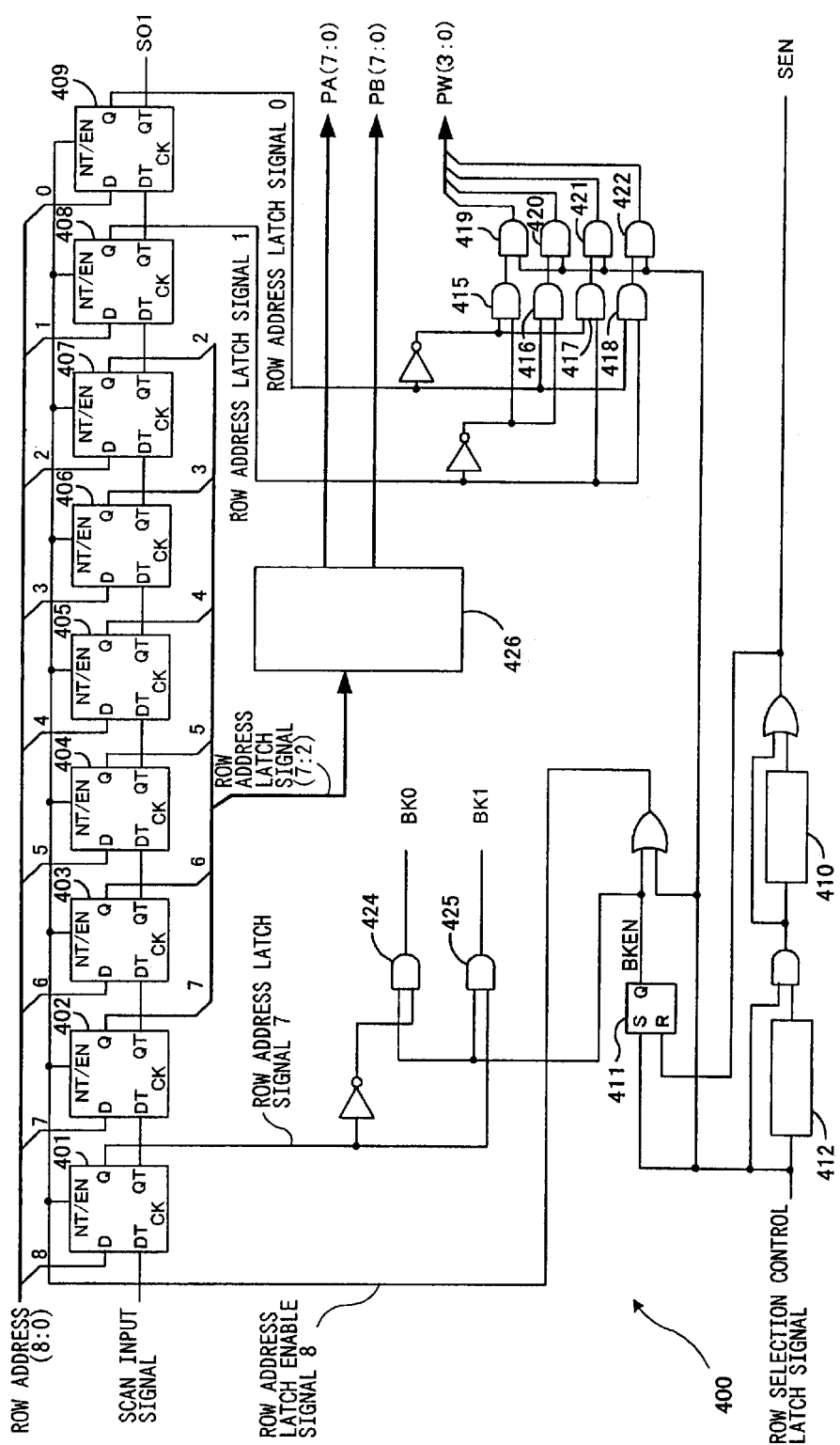
FIG. 4 is a circuit diagram of a row pre-decoder 400 according to the present invention.

The row pre-decoder 400 as a row address input section is constructed of 9 (m=9) latch circuits from 1st to 9th row latch circuits 401 to 409 as shown in FIG. 4.

Figure 6:
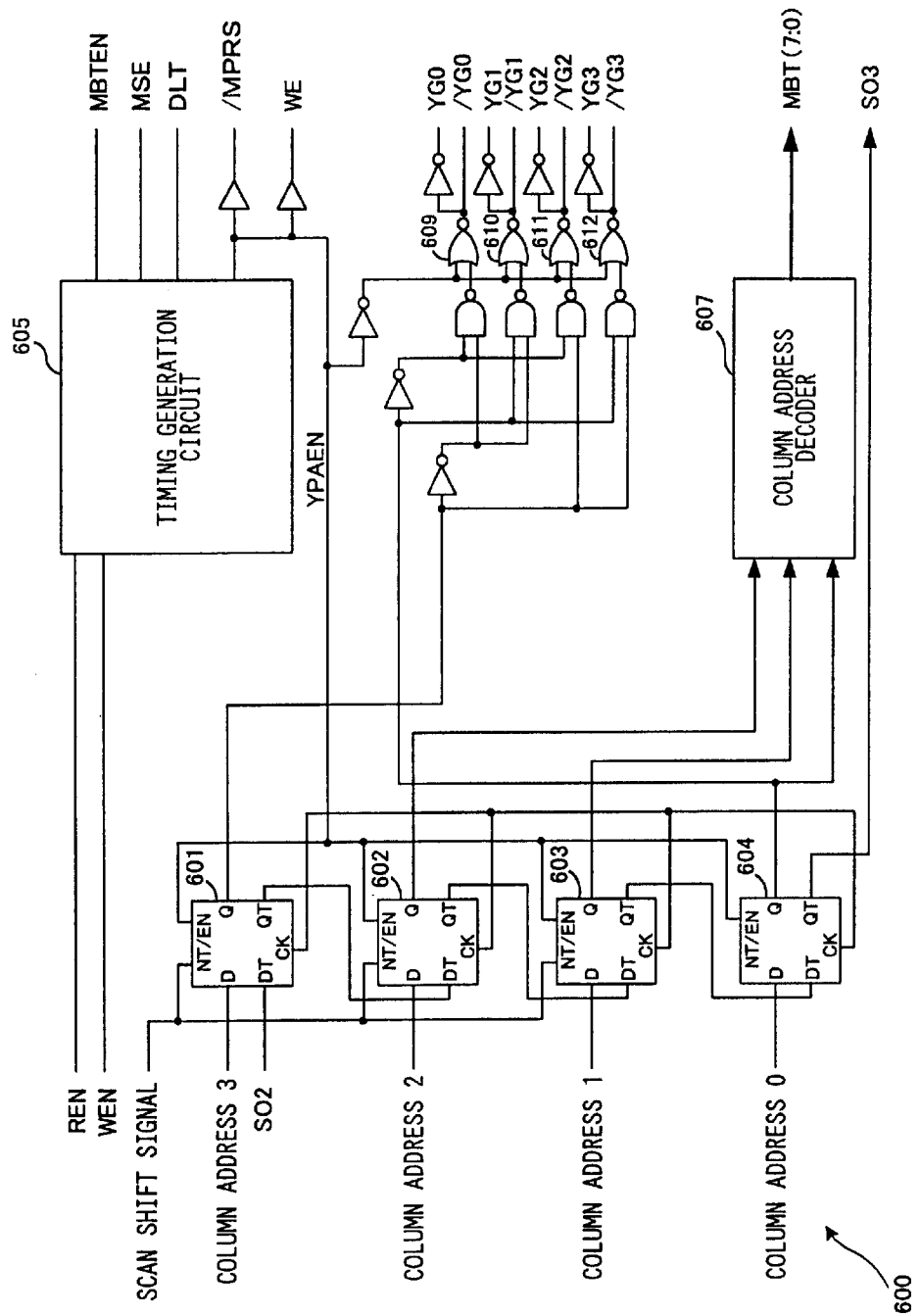
FIG. 6 is a circuit diagram of a column selection control circuit 600 according to the present invention.

The column selection control circuit 600 as a column address input section is constructed of 4 (n=4) latch circuits from 1st to 4th column latch circuits 601 to 604 as shown in FIG. 6.

Figure 5:
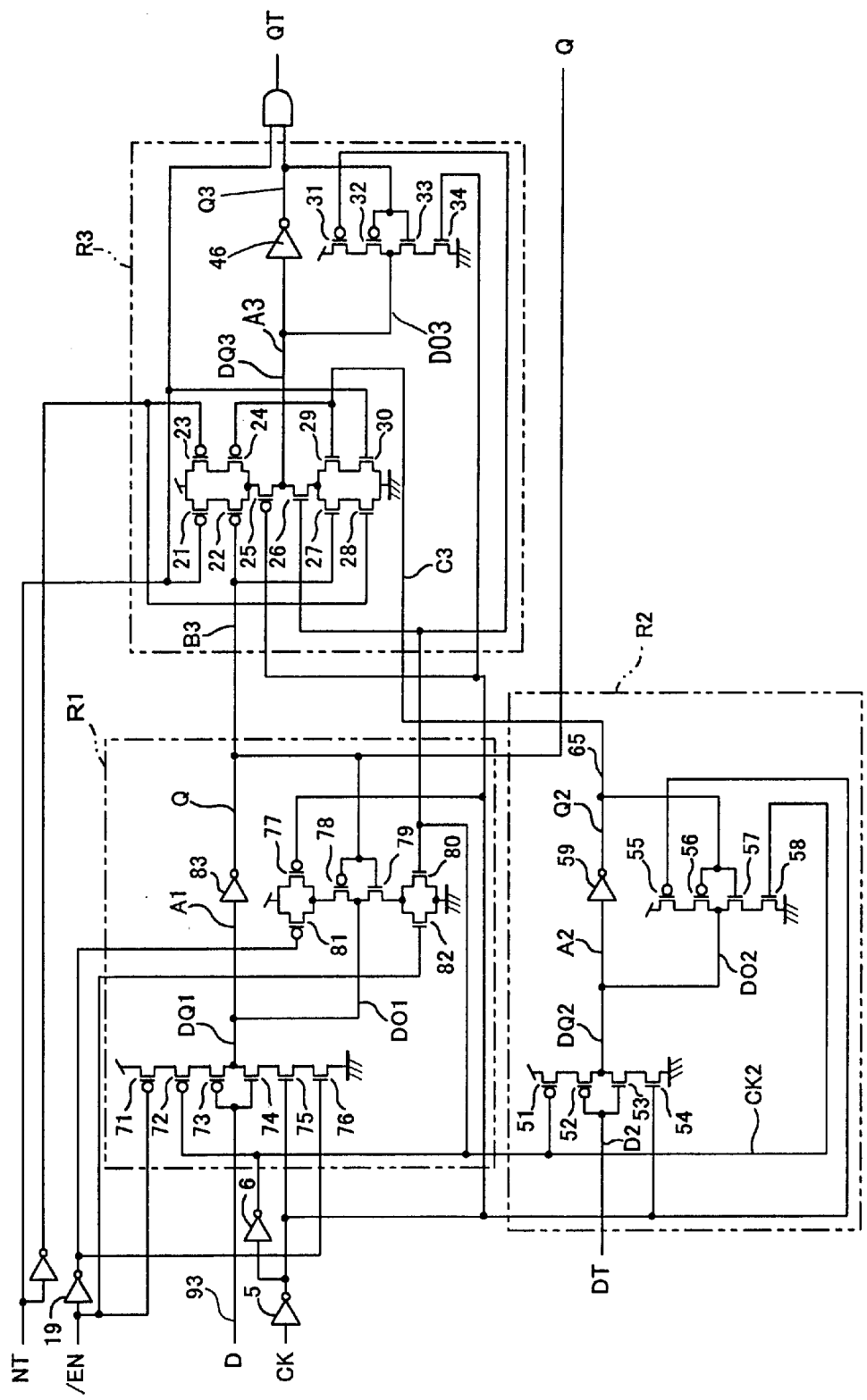
FIG. 5 is a circuit diagram of a 1st level latch circuit with an enable according to the present invention.
Figure 8:
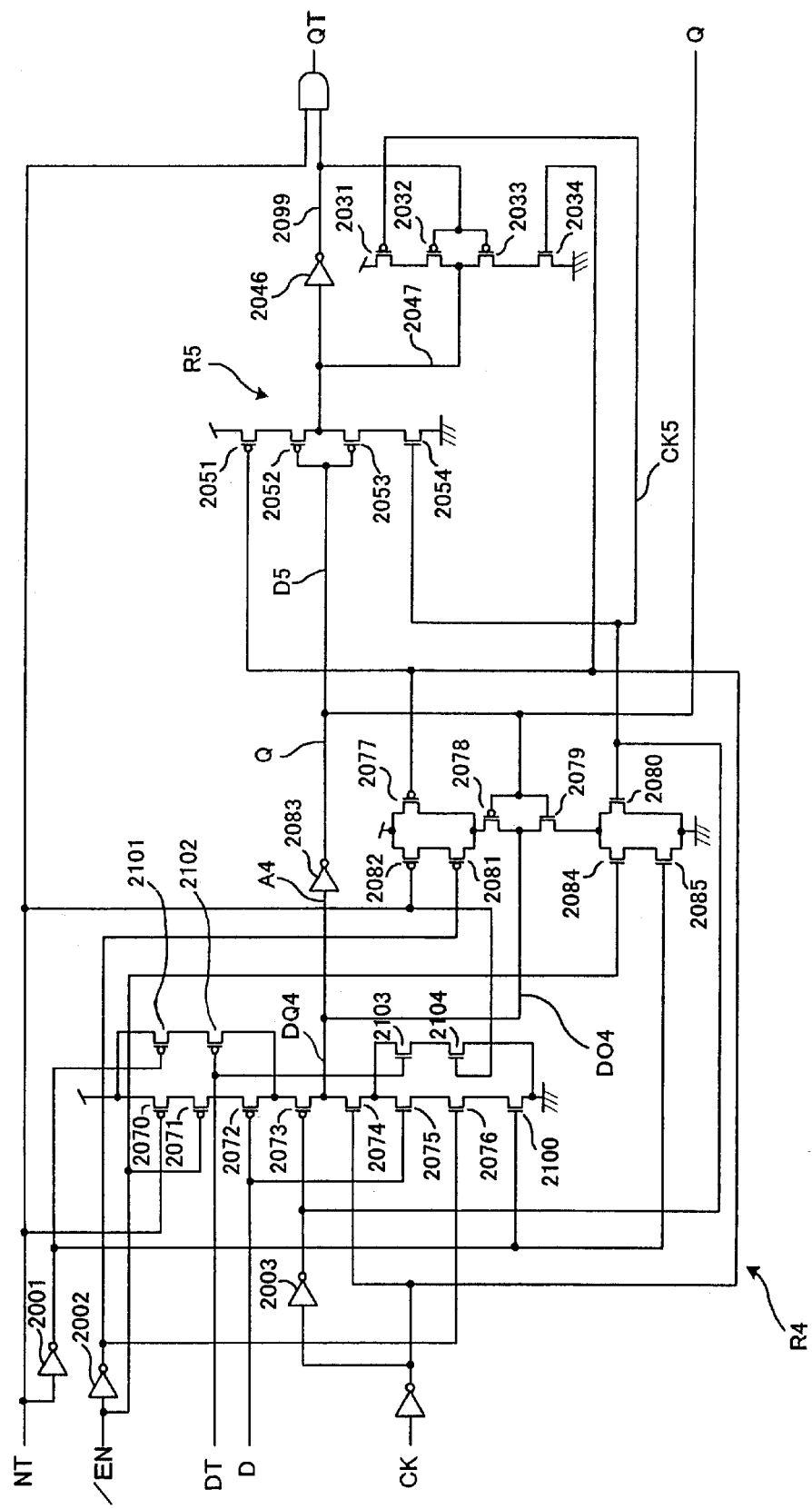
FIG. 8 is a circuit diagram of a 2nd level latch circuit with an enable according to the present invention.

The following explanations will describe two cases of latch circuits with an enable of the latch circuits 401 to 409 and 601 to 604; one case where a latch circuit shown in FIG. 5 is used and the other case where a latch circuit shown in FIG. 8 is used.

Figure 11:
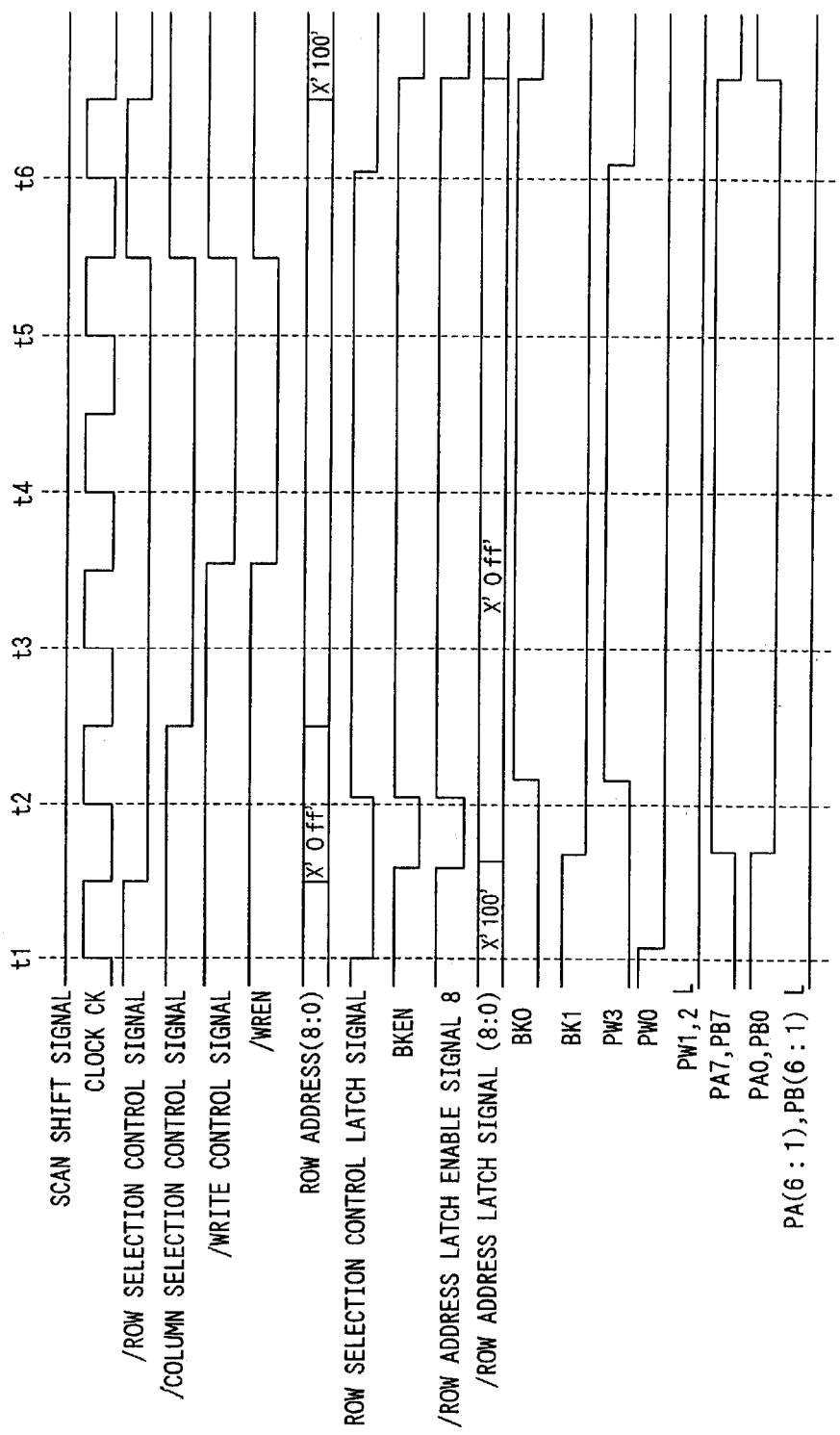
FIG. 11 is a read/write timing chart during normal operation of DRAM 900.
Figure 12:
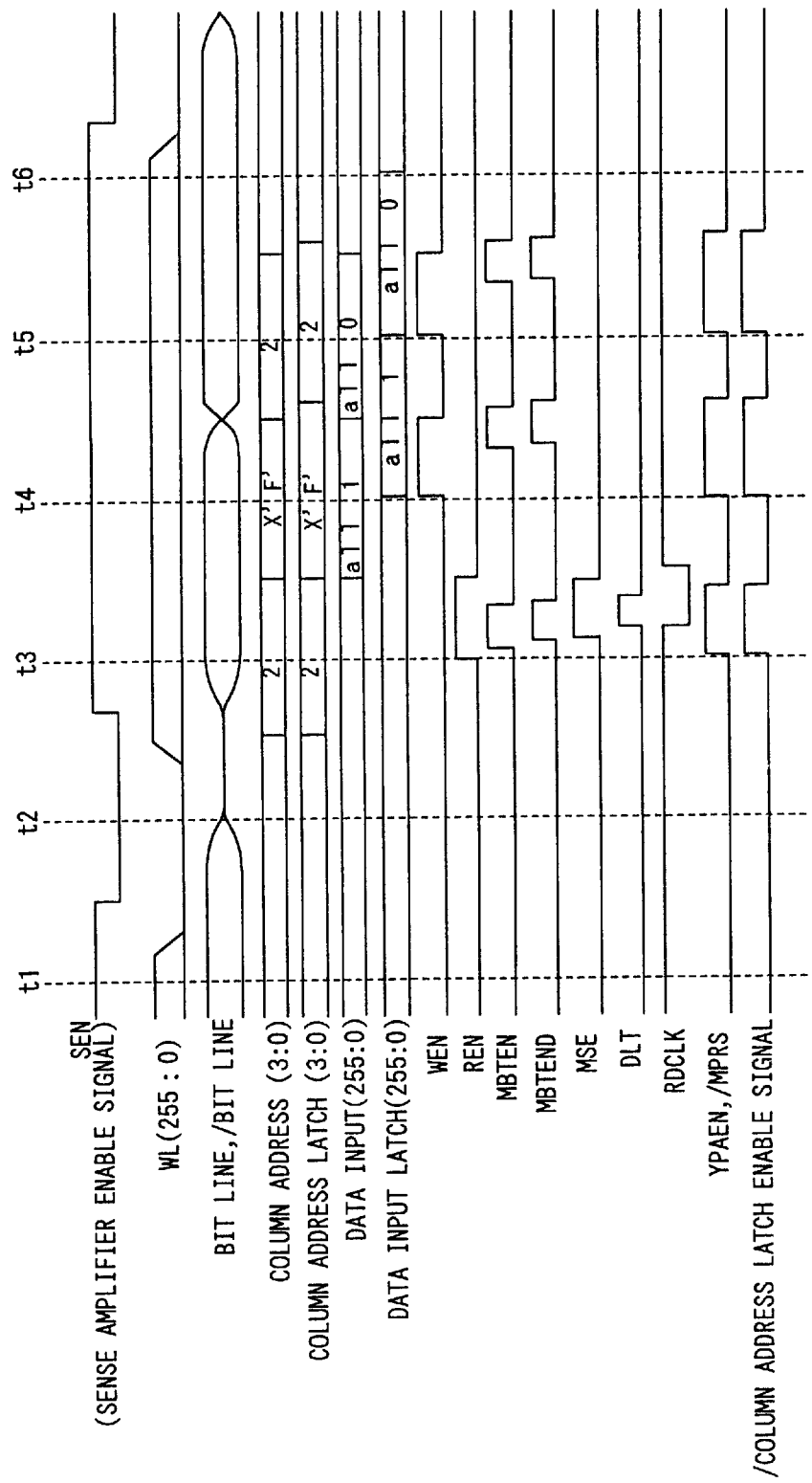
FIG. 12 is a read/write timing chart during normal operation of DRAM 900.
Figure 13:
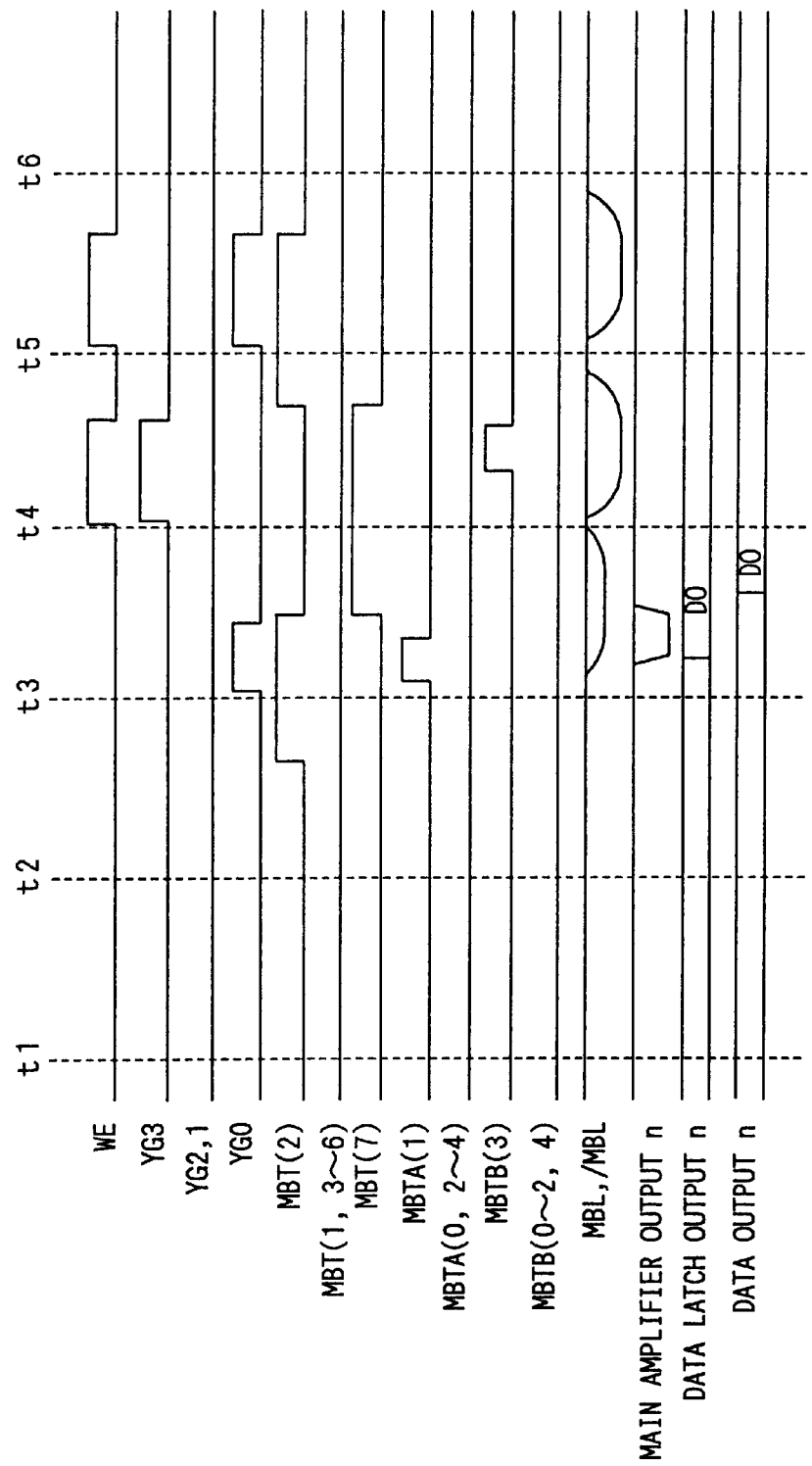
FIG. 13 is a read/write timing chart during normal operation of DRAM 900.

The read operation of the DRAM 900 will be explained using FIG. 11, FIG. 12 and FIG. 13.

Figure 3:
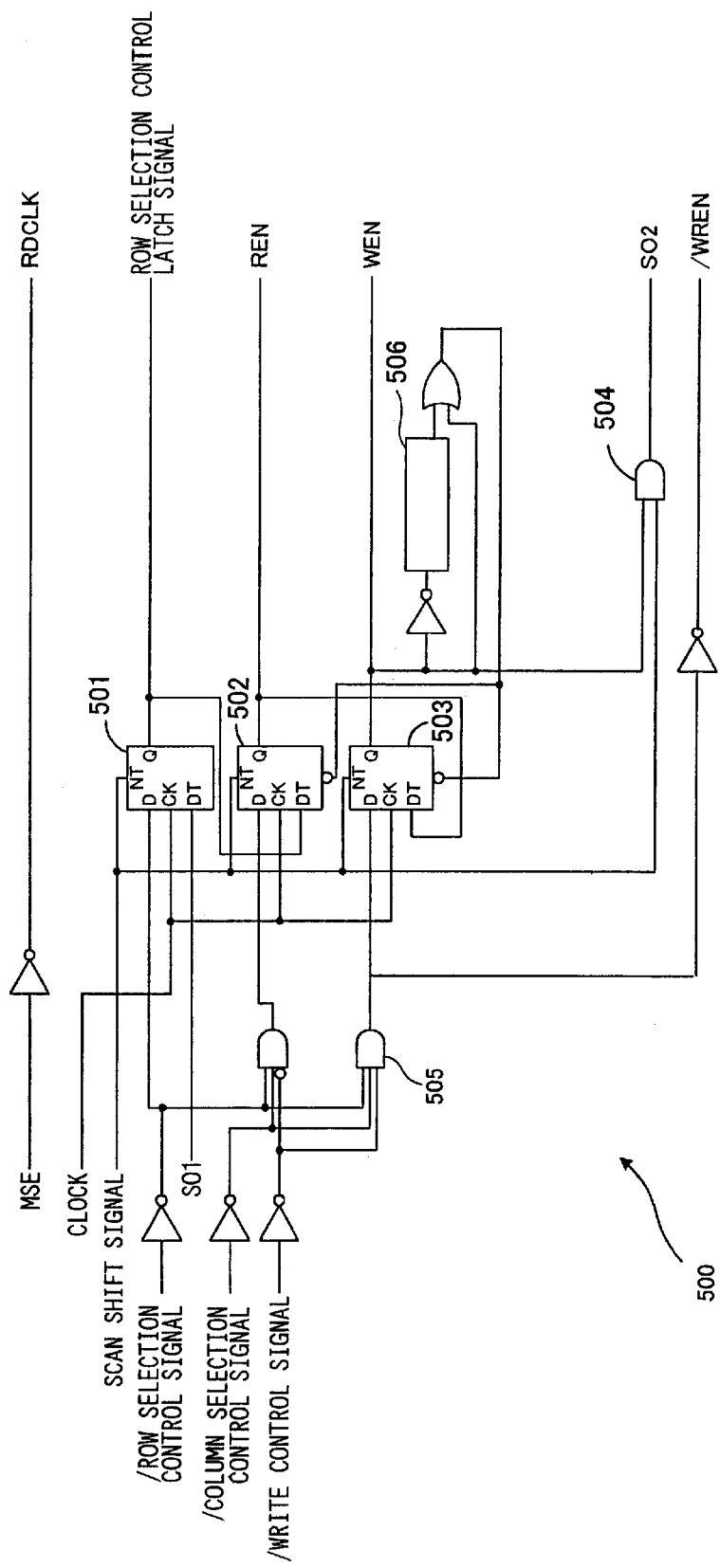
FIG. 3 is a circuit diagram of a control circuit 500 according to the present invention.

Before time t1, a DRAM read operation is performed and since the /row selection control signal="H" at time t1, the row selection control latch signal as the internal row selection control signal which is the /row selection control signal synchronized with the clock by the D flip f lop 501 shown in FIG. 3 is driven "L" and all PW (3:0) shown in FIG. 4 are driven "L" and thereby the selected WL is driven "L". Then, a delay circuit 410 delays the signal for a certain time, a sense amplifier enable signal (hereinafter abbreviated as "SEN") is driven "L", and thereby a set/reset circuit 411 is reset and BKEN, which is a memory block selection enable signal, is driven "L".

This drives BK1, which is a memory block selection signal, to "L" and drives /BK1 to "H", causing bit lines and /bit lines of block 102 and block 104 of the memory cell array 100 to be precharged to (½) Vdd.

In FIG. 4, BKEN is driven "L" and the memory block is non-selected irrespective of the row address latch signals (8:0) and while the row selection control latch signal as an internal row selection control signal is "L", the /row address latch enable signal is driven "L".

First, the operation of the level latch with an enable shown in FIG. 5 used for the latch circuit in FIG. 4 will be explained in detail.

The level latch with an enable shown in FIG. 5 is constructed of five inputs of a clock input (CK input), enable signal input (/EN input), test control data input (NT), data input (D input), test input (DT), and two outputs; an output Q (Q output) and a test output (QT), 1st latch means R1, 2nd latch means R2 and 3rd latch means R3.

The 1st latch means R1 includes a 1st data input circuit constructed of transistors 71 to 76 and a 1st data holding circuit constructed of transistors 77 to 82 and an inverter 83.

The above described 1st data input circuit is fed the above described clock input (CK input), the above described enable signal input (/EN input) and the above described data input (D input) and outputs DQ1, and when the above described enable signal input (/EN input) is active ("L") and the above described clock input (CK input) is at the 1st logic level, outputs the inverted level of the above described data input (D input) to the above described DQ1, and when the above described enable signal input (/EN input) is non-active ("H") or the above described clock input (CK input) is at the 2nd logic level, holds DQ3 at high impedance.

The above described 1st data holding circuit is constructed of the inverter 83, which is fed A1 and outputs the output Q (Q output) and the 1st output control circuit, and A1 is connected to DQ1.

The above described 1st output control circuit includes three inputs; the above described output Q (Q output), the above described clock input (CK input) and the above described enable signal input (/EN input), and an output (DO1) input to the above described (A1), and when the above described enable signal input (/EN input) is non-active ("H") or the above described clock input (CK input) is at the 2nd logic level, outputs the inverted level of the above described output Q to the above described (DO1), and when the above described enable signal input (/EN input) is active ("L") and the above described clock input (CK input) is at the 1st logic level, holds (DO1) at high impedance.

The 2nd latch means R2 is constructed of a 2nd data input circuit made up of transistors 51 to 54 and a 2nd data holding circuit made up of transistors 55 to 58 and an inverter 59, includes two inputs; a 2nd data input (D2 input=DT) and a 2nd clock input (CK2), and an output (DQ2), and when the above described 2nd clock input (CK2) is at the 1st logic level, outputs the inverted level of the above described 2nd data input (D2 input) to the above described output (DQ2) and when the above described 2nd clock input (CK2) is at the 2nd logic level, holds the above described (DQ2) at high impedance, and the above described 2nd data holding circuit is constructed of an inverter 59, which is fed the above described (A2) and outputs the above described 2nd output Q2 (Q2), and a 2nd output control.circuit, and the above described (A2) is connected to the above described (DQ2), the above described 2nd output control circuit includes two inputs; the above described 2nd output Q2 (Q2) and the above described 2nd clock input (CK2), and an output (DO2) input to the above described A2, and when the above described 2nd clock input (CK2) is at the 2nd logic level, outputs the inverted level of the above described 2nd output Q2 to the above described (DO2), and when the above described 2nd clock input (CK2) is at the 1st logic level, holds the above described 2nd output Q2 (Q2) at high impedance, and the above described 2nd data input (D2 input) is connected to the above described test input (DT) and the above described 2nd clock input (CK2) is connected to the above described clock input (CK input).

The above described 3rd latch means R3 is constructed of a 3rd data input circuit made up of transistors 21 to 30 and a 3rd data holding circuit made up of transistors 31 to 34 and an inverter 46.

The above described 3rd data input circuit includes three inputs; (B3) to which the above described output Q (Q output) is input, (C3) to which the above described 2nd output Q2 (Q2) is input and the above described test control data input (NT) and the above described clock input (CK input), and a 3rd output (DQ3), and when the above described clock input (CK input) is at the 2nd logic level and the above described test control data input (NT) is non-active ("L"), outputs the inverted level of the above described output Q (Q output) to the above described (DQ3) and when, the above described test control data input (NT) is active ("H"), outputs the inverted level of the above described 2nd output Q2 (Q2) to the above described (DQ3) and when the above described clock input (CK input) is at the 1st logic level, holds the above described (DQ3) at high impedance.

The above described 3rd data holding circuit is constructed of the inverter 46 that is fed (A3) and outputs the 3rd output Q3 and the 3rd output control circuit, and the above described (A3) is connected to the above described (DQ3).

The above described 3rd output control circuit includes two inputs; the above described 3rd output Q3 and the above described clock input (CK input), and an output (DO3) input to the above described (A3), and when the above described clock input (CK input) is at the 1st logic level, outputs the inverted level of the above described 3rd output Q3 to the above described (DO3), and when the above described clock input (CK input) is at the 2nd logic level, holds the above described 3rd output Q3 at high impedance and the above described 3rd output Q3 is connected to the above described test output (QT).

Since /EN="L" and CK="L", transistors 71, 72, 75 and 76 are turned ON, and therefore the row address input to the D input is directly output to Q and it is possible to start decoding of the row address decoder 426 and decoding up to just before the AND gates 424 and 425 for BK0 and BK1 and decoding up to just before the AND gates 419 to 422 for PW (3:0) before the clock rises at time t2, and therefore this decoding can be completed by time t2.

Then, the operation when the level latch circuit with an enable shown in FIG. 8 is used as the latch circuit in FIG. 4 will be explained in detail below.

The level latch circuit with an enable shown in FIG. 8 is constructed of five inputs of clock input (CK input), enable signal input (/EN input), test control data input (NT), data input (D input) and test input (DT), and two outputs; an output Q (Q output) and a test output (QT), and 4th latch means R4 and 5th latch means R5.

The 4th latch means R4 is constructed of a 4th data input circuit made up of transistors 2070 to 2076, 2101 to 2104 and a 4th data holding circuit made up of transistors 2081, 2082, 2084, 2085, 2077 to 2080 and an inverter 2083.

The above described 4th data input circuit is fed the above described clock input (CK input), the above described enable signal input (/EN input) and the above described test control data input (NT) and the above described data input (D input) and outputs (DQ4) and when the above described test control data input (NT) is non-active ("L"), the above described enable signal input (/EN input) is active ("L") and the above described clock input (CK input) is at the 1st logic level, outputs the inverted level of the above described data input (D input) to the above described (DQ4) and when the above described test control data input (NT) is active ("H") and the above described clock input (CK input) is at the 1st logic level, outputs the inverted level of the above described (DT) to the above described (DQ4), and when the above described test control data input (NT) is non-active ("L") and the above described enable signal input (/EN input) is non-active ("H") or the above described clock input (CK input) is at the 2nd logic level, holds (DQ4) at high impedance.

The above described 4th data holding circuit is constructed of the inverter 2083 that is fed (A4) and outputs the above described output Q and a 4th output control circuit, the above described (A4) is connected to the above described (DQ4), the above described 4th output control circuit has four inputs of the above described output Q (Q output), the above described clock input (CK input) and the above described enable signal input (/EN input) and the above described test control data input (NT), and an output (DO4) input to the above described (A4) and when the above described test control data input (NT) is non-active ("L") and the above described enable signal input (/EN input) is non-active ("H") or the above described clock input (CK input) is at the 2nd logic level, outputs the inverted level of the above described output Q to the above described (DO4) and when the above described test control data input (NT) is active ("H") or the above described enable signal input (/EN input) is active ("L") and the above described clock input (CK input) is at the 1st logic level, holds the above described (DO4) at high impedance.

The above described 5th latch means R5 is constructed of a 5th data input circuit and the 5th data holding circuit.

The above described 5th data input circuit has two inputs; a 5th data input (D5) and a 5th clock input (CK5), and an output (DQ5), and when the above described 5th clock input (CK5) is at the 2nd logic level, outputs the inverted level of the above described (D5) to the above described output (DQ5) and when the above described 5th clock input (CK,5) is at the 1st logic level, holds the above described (DQ5) at high impedance, the above described (DQ5) is connected to the above described (A3) of the above described 3rd data holding circuit, and the above described 5th data input (D5) is connected to the above described output Q, and the above described 5th clock input (CK5) is connected to the above described clock input (CK input).

The above described 5th data holding circuit is constructed of transistors 2031 to 2034 and an inverter 2046, and has the same configuration as that of the 3rd data holding circuit described in FIG. 5.

Since NT="L", /NE="L" and CK="L", transistors 2070, 2071, 2073, 2074, 2076 and 2100 are turned ON and transistors 2101 and 2104 are turned OFF and the row address input to the D input is directly output to Q, and therefore it is possible to start decoding of the row address decoder 426 and decoding up to just before the AND gates 424 and 425 for BKO and BK1 and decoding up to just before the AND gates 419 to 422 for PW (3:0) before the clock rises at time t2, and therefore this decoding can be completed by time t2.

Therefore, at time t2, the /row selection control signal is driven "L" and immediately after the row selection control latch signal is driven "H" as the internal row selection control signal in FIG. 4, the AND gates 419 to 422 are enabled and the row address latch signal 1=row address latch signal 0="H" from among PW (3:0) used to select word lines (hereinafter referred to as "WL") generated by the row address decoders 701 to 704 in FIG. 1, and therefore only PW3 is driven "H". At the same time, the set/reset circuit 411 is set and BKEN="H", then the AND gates 424 and 425 are enabled and the row address latch enable signal 8="L", and only BK0 is "H", and therefore block 101 and block 103 in the memory cell array 100 in FIG. 1 are selected. Reference numerals 705 to 709 are sense amplifier drivers.

Furthermore, as shown in FIG. 1 and FIG. 2, one sense amplifier SA is shared by blocks on both sides and an Nch transistor SW which connects the bit lines and /bit lines of block 101 and block 103 and the sense amplifier is turned ON and a ½ Vdd precharge of these bit lines and /bit lines is stopped. Then, the eight row address pre-decode signals which are the outputs of the row pre-decoder 400 and PW (3:0) are decoded and only WL255 is enabled and the data of the memory cells to which WL255 of block 101 and block 103 is connected is output to the bit lines and /bit lines. Then, when the row selection control latch signal as the internal row selection control signal shown in FIG. 4 is driven "H", after a certain delay by the delay circuit 412, SEN is driven "H" and the sense amplifiers on both the sides of block 101 and block 103 are enabled. In this way, the data read out to the bit lines and /bit lines of the memory cells of the block 101 and block 103 connected to the WL255 is amplified by the sense amplifier.

On the other hand, at time t2 in FIG. 11, FIG. 12 and FIG. 13, the operation of the level latch circuits with an enable 401 to 409 in FIG. 4 when the clock CK is driven from "L" to "H" will be explained. First, when the latch in FIG. 5 is used, CK is driven "H", and therefore transistors 72 and 74 are turned OFF, no row address is input from the D input and transistors 77 and 80 are turned ON, and therefore the data immediately before CK is driven "H" is held by the transistors 77 to 82 and inverter 83. Immediately after this, since the /row selection control signal="L", the row selection control latch signal as the internal row selection control signal is driven "H" and the /row address latch enable signal is driven "H", and therefore the transistors 71 and 75 are turned OFF and the transistors 81 and 82 are turned ON, and even if CK is driven "L" in this state, no row address is input from the D input and the data is held.

Then, when the latch circuit in FIG. 8 is used, CK is driven "H", and therefore the transistors 2073 and 2074 are turned OFF, no row address is input from the D input and the transistors 2077 and 2080 are turned ON, and therefore the data immediately before CK is driven "H" is held by the transistors 2077 to 2080 and inverter 2083. Immediately after this, since the /row selection control signal becomes "L", the row selection control latch signal as the internal row selection control signal is driven "H" and the /row address latch enable signal is driven "H", and therefore the transistors 2071 and 2076 are turned OFF and transistors 2081, 2082, 2084 and 2085 are turned ON, and even if CK is driven "L" in this state, no row address is input from the D input and the data is held.

Then, the data read operation by column control will be explained below.

At t2, the /column selection control signal is "H" and the output of DFF 502 in FIG. 3 is driven "L", and therefore REN, which is a read start signal, is driven "L" and YPAEN, which is a decode enable signal of the column address is driven "L"by the timing generation circuit 605 in FIG. 6, and therefore /MPRS, which is the precharge signal of the main bit line is also driven "L" and the main bit line is precharged. Since YPAEN, which is a /column address latch enable signal of the level latch circuits with an enable 601 to 604 of the column addresses (3:0), is "L", when the clock becomes "L" in the cycle at time t2, the input column addresses (3:0) are directly output to Q. Thus, regarding decoding of the column address decoder 607, YG (3:0) and NYG (3:0), decoding up to just before NOR gates 609 to 612 can be started before the clock rises at time t3, and therefore it is possible to complete this decoding by time t3. Therefore, at time t3, the /column selection control signal is driven "L" and immediately after REN is driven "H" in FIG. 4, YPAEN is driven "H" and /MPRS is driven "H", the precharge of the main bit line is canceled, NOR gates 609 to 612 are enabled and since the latch signal of the column address 3=latch signal of column address 0="L", only YG0 is enabled resulting in YG0="H" and /YG0="L". Since the latch signal of the column addresses (3:0)=2, only MBT2 which is decoded by the column address decoder 607 in FIG. 6 is driven "H". As shown in timings in FIG. 11, FIG. 12 and FIG. 13, a certain time after t3, when a signal that enables the connections of the bit lines, /bit lines and main bit lines and /main bit lines (hereinafter abbreviated as "MBTEN") is driven "H", the input MBT2 is "H" in the sense amplifier driver 706 in FIG. 1, and therefore MBTA (1), which is the gate input of the Nch transistor that makes the connection above, is driven "H". Since MBT1, MBT3 to 7="L", MBTA (0), MBTA (2), (3), MBTB (0) to (3) are all "L". Since MBTA (1)="H", the sense amplifiers and main bit lines and /main bit lines with "SA1_odd number" in FIG. 2 are connected.

The operation after the connections are established will be explained using the timing charts in FIG. 7 and FIG. 11, FIG. 12 and FIG. 13 in detail.

Figure 7:
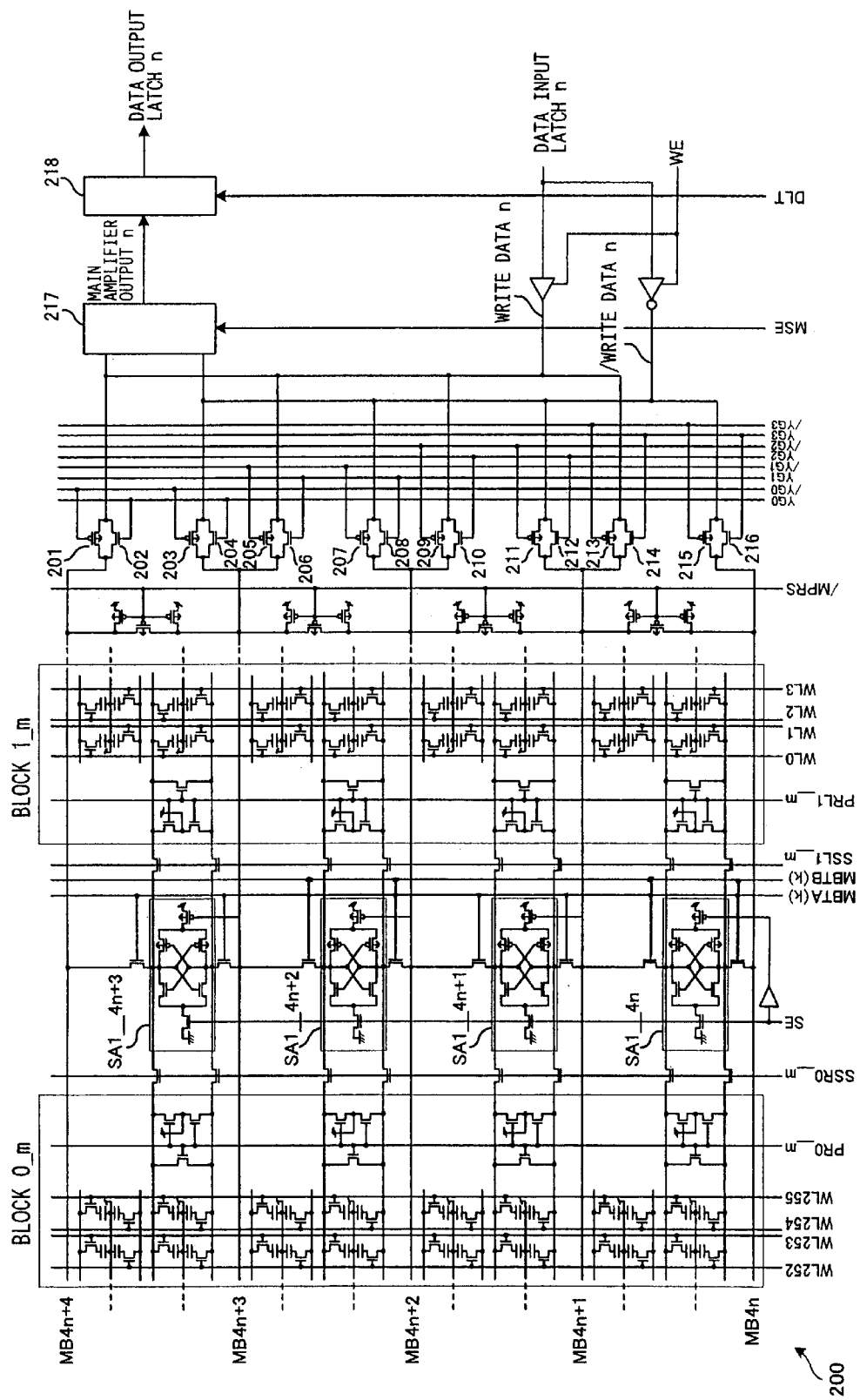
FIG. 7 is a circuit diagram in a basic configuration unit of a main amplifier block 200.

In FIG. 7, block 0_m corresponds to the blocks 101 and 103 in FIG. 2, and block 1_m corresponds to the blocks 102 and 104 in FIG. 2. Here, the circuit parts when k=1, l=1, m=1 will be explained.

Since MBTA (1)="H", SA1_4n+1 and MB4n+1, MB4n+2, SA1_4n+3 and MB4n+3, MB4n+4 are connected. As the explanation above, YG0="H", NYG0="L", and therefore only transistor SW 201 to 204 are turned ON, and MB4n+3 and MB4n+4 are input to the main amplifier 217. MSE is generated by the timing generation circuit 605 in FIG. 6 so that a certain time after MBTA (1) is driven "H" the main sense amplifier enable signal (hereinafter abbreviated as "MSE") is driven "H". When MSE is driven "H", the main amplifier 217 differentially amplifies the voltage difference between signals MB4n+3 and MB4n+4 and outputs to the data latch circuit 218. The timing generation circuit 605 drives DLT to "H" immediately after MSE is driven "H". The timing generation circuit 605 drives DLT to "L" after a delay of the time required for the output of the main amplifier 217 to stabilize and for the data latch circuit 218 to complete the latching. The timing generation circuit 605 in FIG. 6 drives MBTEND to "L" after a lapse of the time required after MBTEN is driven "L" until MBTA (1) is driven "L". The timing generation circuit 605 drives YPAEN to "L" at timing of either MBTEND or DLT, whichever is driven "L" later. When YPAEN is driven "L", /MPRS is driven "L", and therefore the main bit line is precharged, the NOR gates 609 to 612 in FIG. 6 are disabled and all YG (3:0) are driven "L" and all /NYG (3:0) are driven "H". At the same time, when YPAEN is driven "L", the /latch enable signal of the level latch circuits with an enable 601 to 604 of the column addresses (3:0) is driven "L" and the clock is "L", then the column addresses (3:0)=X 'F' are directly output as the latch signals of the column addresses (3:0), decoding is started immediately and completed by time t4. On the other hand, the interface section 300 latches the data latch output n of the data latch circuit 218 of the main block 200 on the rising edge of RDCLK which is MSE delayed and inverted by the timing generation circuit 605 and outputs the data output n to the logic section.

The operation of the level latch circuits with an enable 601 to 604 of the column addresses (3:0) at t3 and t4 will be explained. First, when the latch circuit in FIG. 5 is used and the clock is driven from "L" to "H", the transistors 72 and 75 are turned OFF and no more row addresses are input from the D input and the transistors 77, 88 are turned ON, and therefore the data immediately before CK of the transistor is driven "H" is held by the transistors 77 to 82 and the inverter 83. Immediately after this, YPAEN is driven "H" and the /column address latch enable signal is driven "H", and therefore the transistors 71 and 76 are turned OFF and the transistors 81 and 82 are turned ON, and even if CK is driven "L" in this state, no more column addresses are input from the D input and the data is held.

Then, when the latch circuit in FIG. 8 is used, the clock is driven from "L" to "H", and CK in FIG. 8 is driven "H" at this time, and therefore the transistors 2073 and 2074 are turned OFF and no more column addresses are input from the D input and the transistors 2077 and 2080 are turned ON, and therefore the transistors 2077 to 2080 and the inverter 2083 hold the data immediately before CK is driven "H". Immediately after this, YPAEN is driven "H", and the /column address latch enable signal is driven "H", the transistors 2071 and 2076 are turned OFF and the transistors 2081, 2082, 2084 and 2085 are turned ON, and therefore even if CK is driven "L" in this state, no more column addresses are input from the D input and the data is held.

The write operation at time t4 will be explained. On the rise of the clock at time t4, the /row selection control signal=/column selection control signal=/write control signal="L", and therefore the AND gate 505 in FIG. 3 is "H" and /WREN="L", the data inputs (255:0) are latched by DFF of the interface block 300, the output of DFF is input to the main amplifier 200 as the data input latch. When WEN, which is the output of DFF 503, is driven "H", YPAEN is immediately driven "H" and WE is driven "H", and therefore, in FIG. 7, the data input latch n="H" is input to the write data n and the /data input latch n is input to the /write data n. At the same time, /MPRS is driven "H" and the precharging of the main bit line is canceled. At this time, since YPAEN="H", the NOR gates 609 to 612 are enabled and the latch signal of the column address 3=latch signal of column address 0="H", and therefore only YG3 is enabled and YG3="H" and /YG3="L", only the transistor SWs 213 to 216 are turned ON, and the write data n is input to MB4n+1 and /write data n is input to MB4n. Moreover, since the latch signals of the column addresses (3:0)=X 'f', these are decoded by the column address decoder 607 in FIG. 6 and only MBT7 is driven "H". Then, as shown in the timings in FIG. 11, FIG. 12 and FIG. 13, when a signal that enables the connections between the bit lines, /bit lines and main bit lines and /main bit lines (hereinafter abbreviated as "MBTEN") is driven "H" a certain time after t4, MBT7 input by the sense amplifier driver 708 in FIG. 1 is "H", and therefore MBTB (3), which is the gate input of the Nch transistor that makes the connection above, is driven "H". Since MBT0 to 6="L", MBTA(0) to (3), MBTB(0) to (2) are all "L". Since MBTB(3)="H", the sense amplifier with SA3_even number and the main bit lines and /main bit lines in FIG. 2 are connected.

The operation after the connections are made will be explained in detail using the timing charts in FIG. 7, FIG. 11, FIG. 12 and FIG. 13.

In FIG. 7, the circuit parts when k=3, l=3 and m=2 will be explained.

Since MBTB(3)="H", SA3_4n+2, MB4n+2, MB4n+3, SA3_4n and MB4n, MB4n+1 are connected, the data of the bit lines connected to SA3_4n of block 0_m is rewritten with write data and the data of the /bit line is rewritten with /write data, connected to the bit lines and the write data is written to the data of the memory cell selected by WL255. Then, when MBTEN is driven "L", MBTB(3) is driven "L", the sense amplifier and main bit lines and /main bit lines are disconnected. In the timing generation circuit 605 in FIG. 6, after a lapse of time required after MBTEN="L" until MBTB(3)="L", MBTEND is driven "L" and when this signal is driven "L", then YPAEN is driven "L". When YPAEN is driven "L", /MPRS is driven "L", and therefore the main bit line is precharged and the NOR gates 609 to 612 in FIG. 6 are disabled and YG (3:0) are all driven "L" and /NYG (3:0) are all driven "H". At the same time, when YPAEN="L", the /latch enable signals of the level latch circuits with an enable 601 to 604 of the column addresses (3:0) are driven "L", and when the clock="L", the column addresses (3:0) are directly output as the latch signals of the column addresses (3:0), decoding is immediately started and completed by time t5. The write operation at time t5 repeats the operation described at t4 except that the addresses to be selected are different.

Then, a test for connection between the logic section and DRAM 900 by a scan test will be explained.

First, in normal operating mode (scan shift signal="L"), a 1 cycle of clock is input to the DRAM 900, the row addresses (8:0) and column addresses (3:0), which are the input signals from the logic, are latched by the level latch circuits with an enable 401 to 409 and 601 to 604, the decoded signals of the /row selection control signal and /row selection control signal, /column selection control signal and /write control signal are latched to the DFF 501 to 503. Then, in order to test whether the input signals are incorporated correctly by the DRAM 900, as shown in FIG. 1, FIG. 3, FIG. 4 and FIG. 6, QTs of the level latch circuits with an enable 401 to 409 and 601 to 604 are input to another level latch with an enable or DT of DFF and QS of DFF 501 to 503 are input to the level latch circuit with an enable or DT of another DFF. Then, a test is conducted by driving the scan shift signal to "H", repeatedly inputting the clock, serially shifting the incorporated data, and externally monitoring S03 of the column selection control circuit 600.

The circuit operation at this time will be explained by quoting the case where the level latch circuit with an enable in FIG. 5 is used and the case where the level latch circuit with an enable in FIG. 8 is used.

First, the case where the level latch circuit with an enable in FIG. 5 is used will be explained in detail using the timing chart in FIG. 14.

Figure 14:
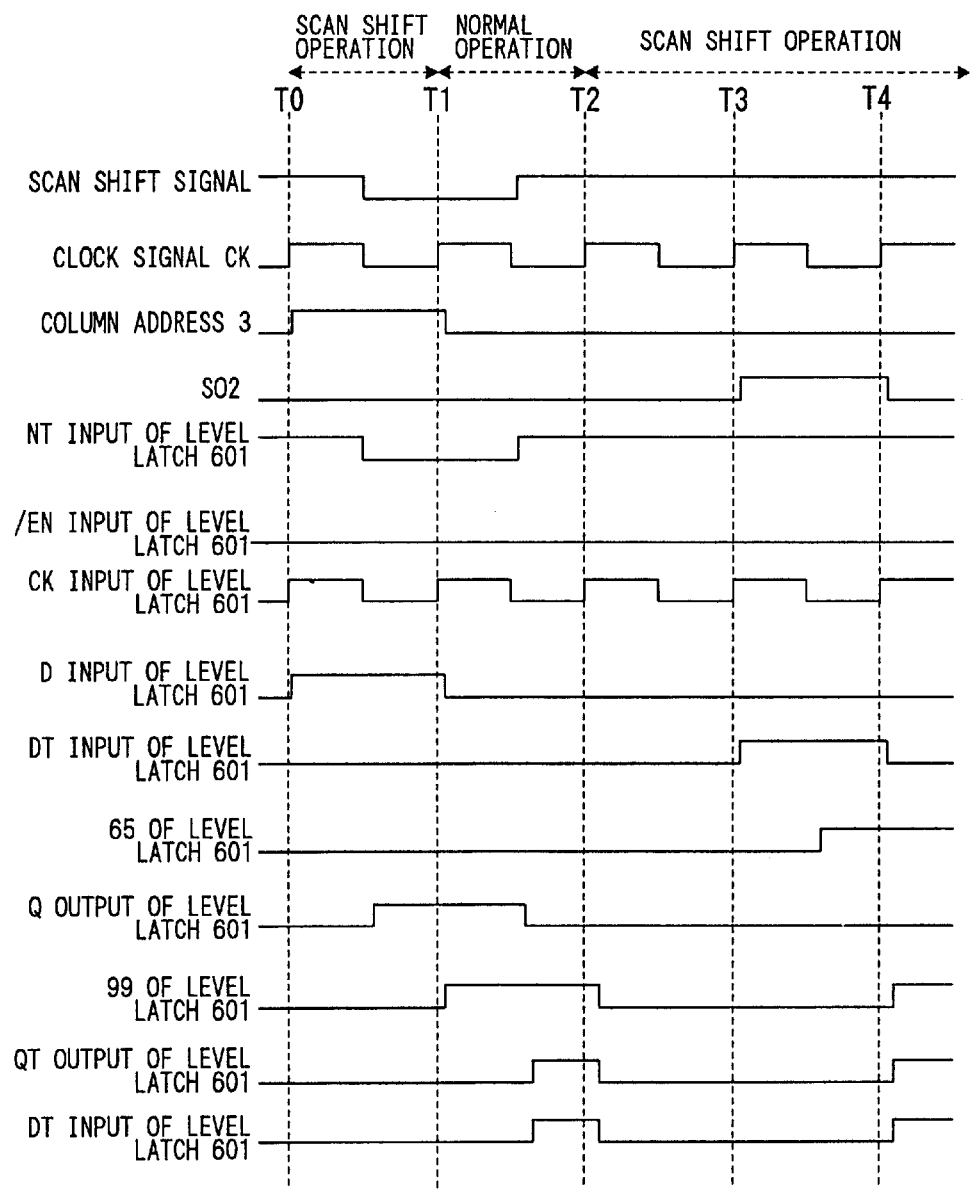
FIG. 14 is a timing chart during a scan test on the 1st level latch circuit with an enable in FIG. 5.

First, at time Ti in FIG. 14, the level latch circuit with an enable 601 is such that in normal operating mode (scan shift signal="L"), when CK is driven from "L" to "H" in FIG. 5, no more data is input from the D input, and the row address ("H") input to D immediately before CK is driven "H" is held by the transistors 77 to 82 and inverter 83. Since CK="H" and scan shift signal=NT="L", the transistors 21, 28, 25 and 26 are turned ON, the data of the Q output is selected and output to the signal 99. When CK="L", no new data is input to the signal 45, and the Q output data is held by the transistors 31 to 34 and inverter 46. In the clock cycle of T1, when the scan shift signal="L" and NT="L", a signal fixed to "L" is output by an AND gate as the QT output. QT is fixed to "L" to avoid using the QT output in normal operation and prevent unnecessary current flow. When the scan shift signal="H", a scan shift operating mode is entered and NT="H", and therefore, the same data as the Q output held as QT is output and this data is input to DT of the level latch circuit with an enable 602 and incorporated in the level latch circuit with an enable 602 at time T2. On the other hand, the DT input of the level latch circuit with an enable 601 fixes S02, which is the output of the AND gate 504 in FIG. 3 input to DT, to "L" when the scan shift signal="L" and in normal operating mode in order to avoid unnecessary current flow in the DT input circuit. When the scan shift signal is driven "H", the Q output of DFF 503 in FIG. 3 is input to DT, and the transistors 51 and 54 in FIG. 5 are turned ON in a section of CK="L", and therefore the Q output of DFF 503 input to DT is input to the signal 65 and CK is driven "H" at time T2, the transistors 51 and 54 are turned OFF, and no more signal is input from DT to the signal 65 and the data is held by the inverter 59 and transistors 55, 56, 57 and 58. Furthermore, since the scan shift signal="H", CK="H", the transistors 23, 25, 26 and 30 are turned ON, the data held of the signal 65 is output to QT. Then, when CK is driven "L", the transistors 25 and 26 are turned OFF, no more new data is input to A3 and the data of the above described signal 99 is held by the transistors 31 to 34 and inverter 46 and output to QT.

Then, the case where the level latch circuit with an enable in FIG. 8 is used will be explained in detail using the timing chart in FIG. 15.

Figure 15:
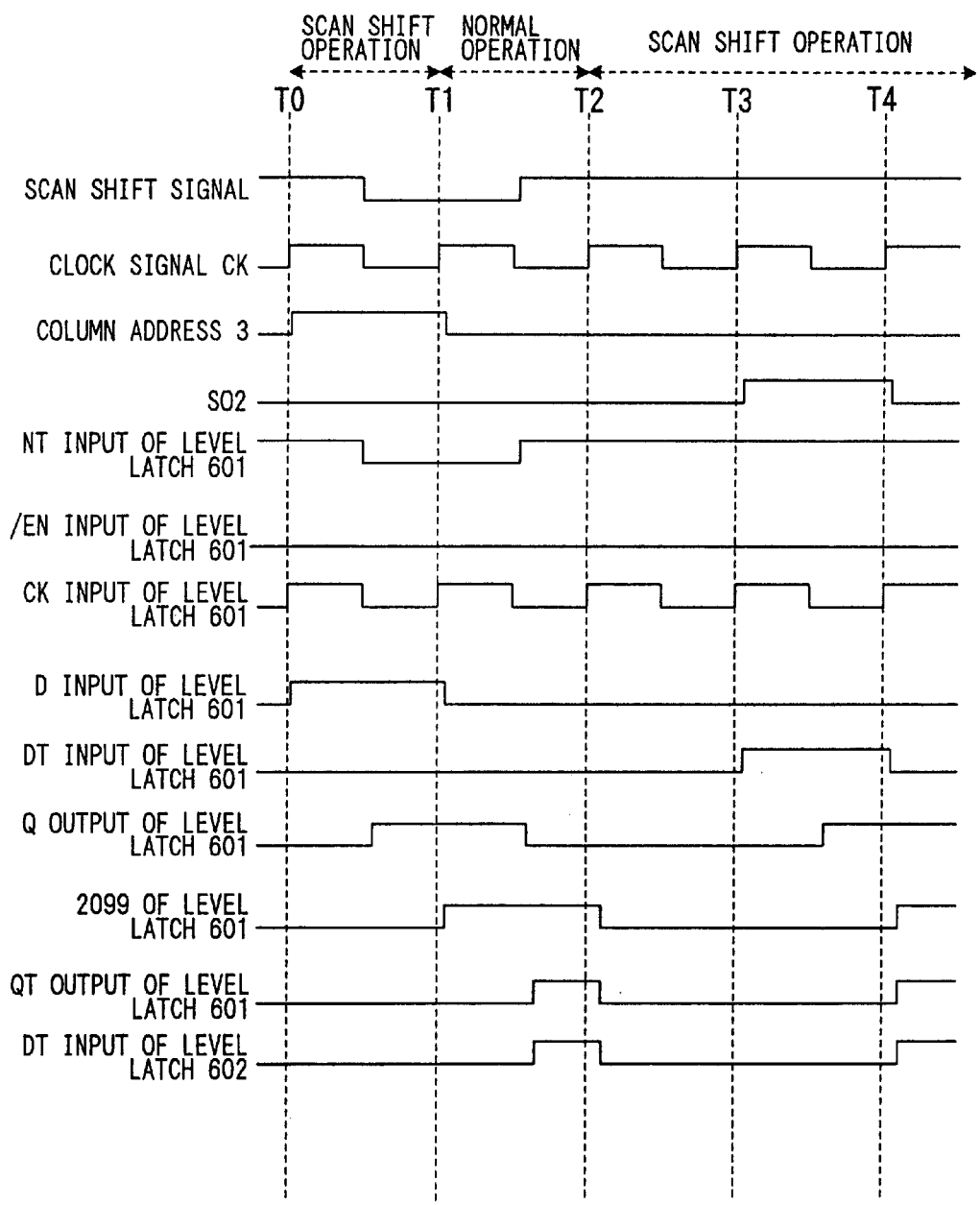
FIG. 15 is a timing chart during a scan test on the 2nd level latch circuit with an enable in FIG. 8.
Figure 16:
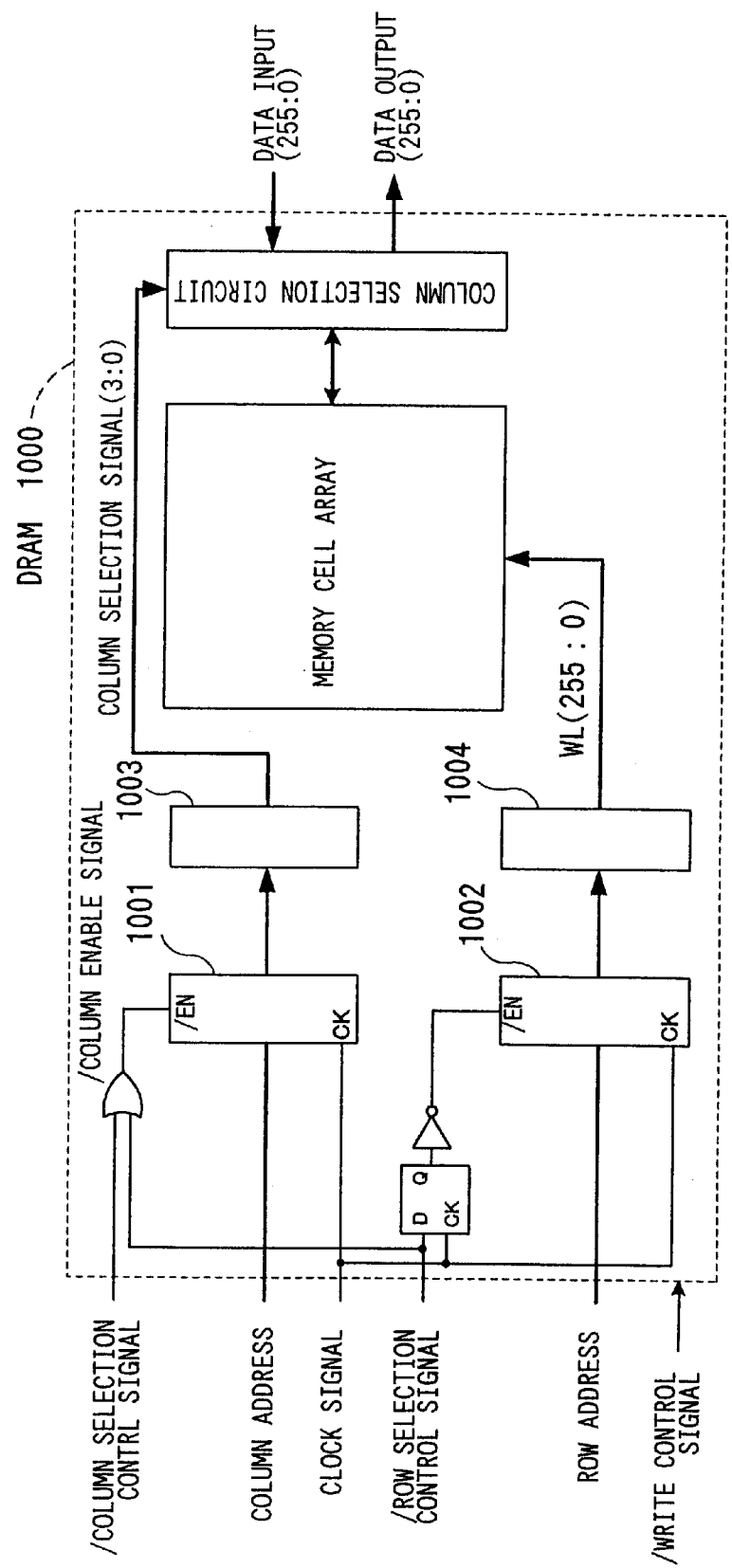
FIG. 16 is a configuration diagram of a conventional DRAM.
Figure 17:
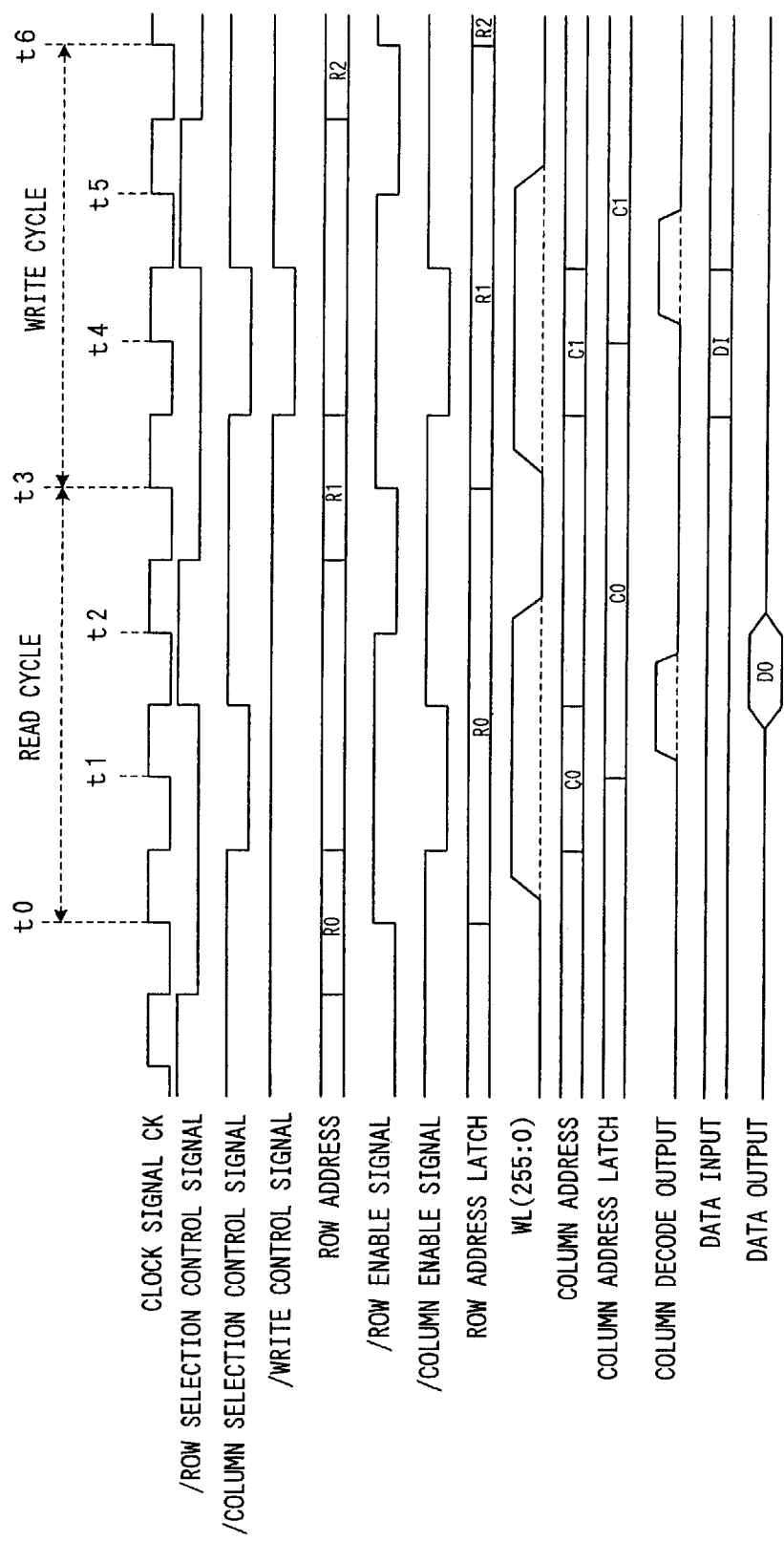
FIG. 17 is a read/write timing chart of the conventional DRAM.

At time T1 in FIG. 15, the latch circuit with an enable 601 is such that when CK is driven from "L" to "H" in FIG. 8 in normal operating mode (scan shift signal=NT="L") first, the transistors 2073 and 2074 are turned OFF and no more row address 3 is input from the D input and the row address ("H") input to the D input immediately before CK is driven "H" is held by the transistors 2077 to 2082, 2084 and inverter 2083. Since CK="H", the transistors 2051 and 2054 are turned ON, the Q output data is selected and output to signal 2099. When CK is driven "L", the transistors 2051 and 2054 are turned OFF, and no more new data is input to 2047, the data of the above described signal 2099 data (the above described output Q data) is held by the transistors 2031 to 2034 and inverter 2046. In a clock cycle of T1, a signal fixed to "L" is output by an AND gate as the QT output when the scan shift signal="L" and NT="L". QT is fixed to "L" to avoid using the QT output in normal operation and prevent unnecessary current flow. When the scan shift signal=NT is driven from "L" to "H" in this cycle, the data of the above described signal 2099 (the above described output Q data) is output as QT, this data is input to DT of the level latch circuit with an enable 602, and incorporated in the level latch circuit with an enable 602 at time T2. On the other hand, the DT input of the level latch circuit with an enable 601 fixes S02, which is the output of the AND gate 504 in FIG. 3 input to DT, to "L" when the scan shift signal="L" in normal operating mode in order to prevent unnecessary current from flowing in the DT input circuit. When the scan shift signal=NT="H" in a cycle of T1, the Q output of DFF 503 in FIG. 3 is input to DT, the transistors 2070 and 2100 in FIG. 8 are turned OFF in the section CK="L" and the transistors 2101 and 2104 are turned ON, and therefore the Q output of DFF 503 input to DT is input to signal Q and CK="H" at time T2, the transistors 2073 and 2074 are turned OFF, and no more signal is input from DT to signal Q, the data is held by the inverter 2083 and transistors 2077 to 2082, 2084 and 2085. Moreover, since CK="H", the transistors 2051 and 2054 are turned ON, the data held of signal Q is input to signal 2099 and output to QT. Then, when CK is driven "L", the transistors 2051 and 2054 are turned OFF, no more new data input to 2047 and the data (the above described output Q data) of the above described signal 2099 is held by the transistors 2031 to 2034 and inverter 2046 and output to QT.

As shown above, the connection between the logic and DRAM 900 can be realized by a scan test.

Figure 9:
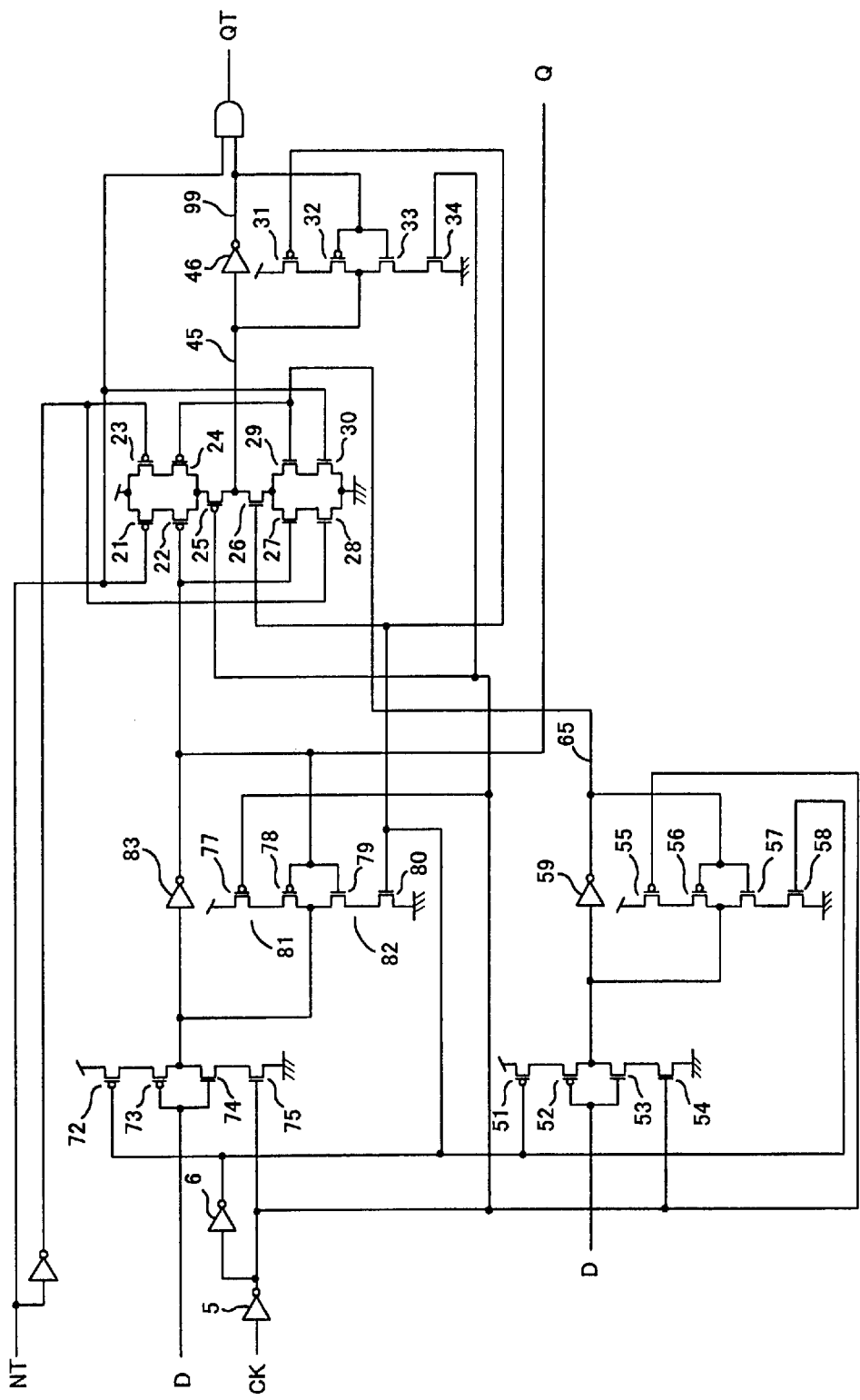
FIG. 9 is a circuit diagram of a 1st level latch circuit according to the present invention.

This embodiment describes the circuit configuration and operation to carry out a scan test using the level latch circuit with an enable, but with the circuit shown in FIG. 9, which is realized by removing the enable control transistors 71, 76, 81, 82, and inverter 19 from the D input section of the circuit in FIG. 5, it is possible to realize a scan test with a level latch circuit that always latches data with a clock input. The scan test operation of this circuit is the same as the circuit operation in FIG. 5 when /EN="L".

Figure 10:
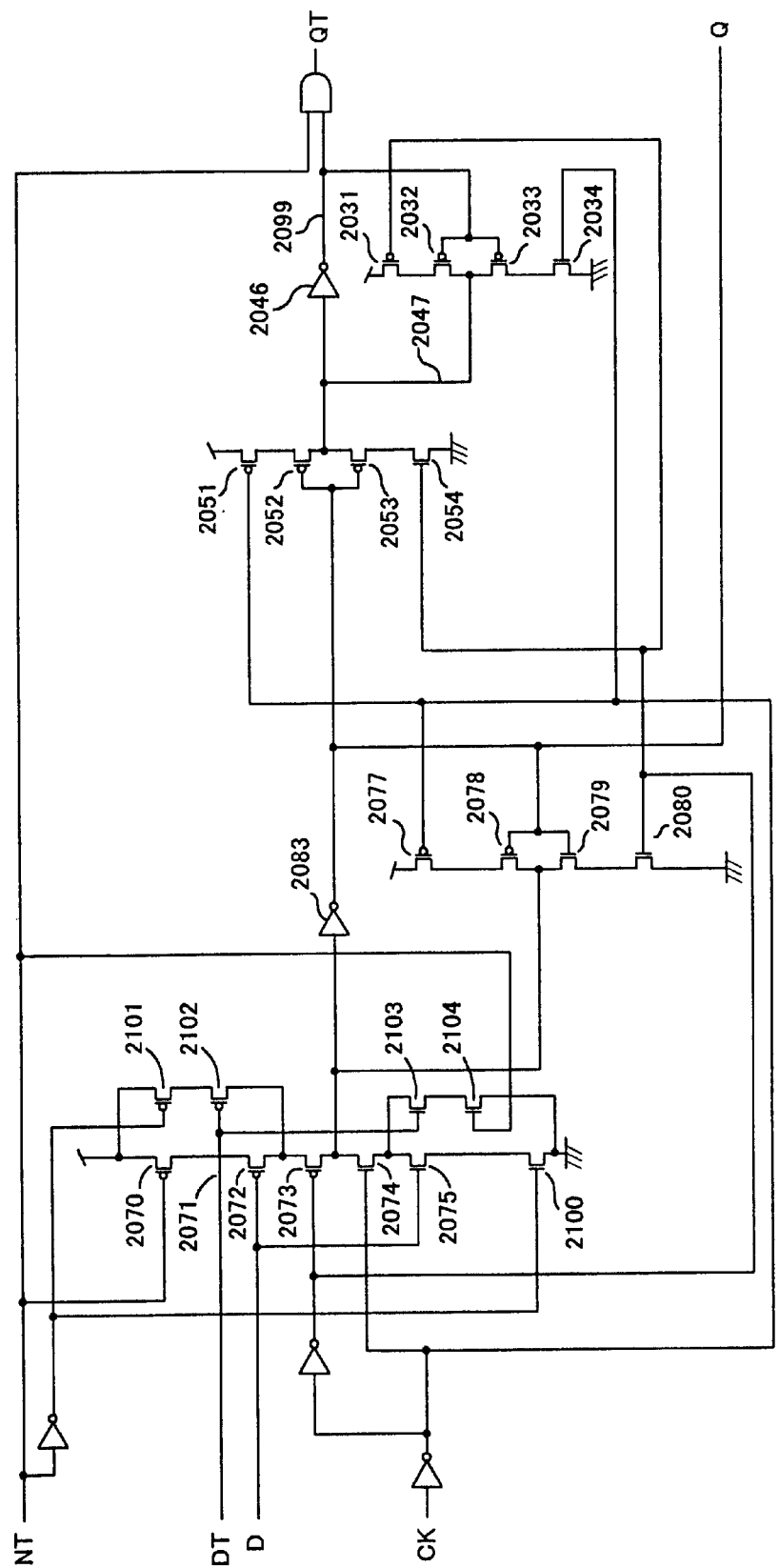
FIG. 10 is a circuit diagram of a 2nd level latch circuit according to the present invention.

Moreover, this embodiment describes the circuit configuration and operation to realize a scan test using the level latch circuit with an enable, but with the circuit shown in FIG. 10, which is realized by removing the enable control transistors 2071, 2076, 2081 and 2084 and inverter 2002 from the D input section of the circuit in FIG. 8, it is possible to realize a scan test with a level latch circuit that always latches data with a clock input. The scan test operation of this circuit is the same as the circuit operation in FIG. 8 when /EN="L".

As a first effect, the configuration according to a first aspect of the present invention starts decoding of row addresses and column addresses when the clock is "L" and can thereby complete decoding on the rise of each operation clock cycle, shorten the operation clock cycle and carry out reads/writes at high speed. Furthermore, while the conventional art carries out tests of connections between row addresses and column addresses of the logic section and memory through an actual operation test on the entire LSI, resulting in a low failure detection rate of the circuit, the present invention, as a second effect, can carry out these tests through a scan test and can thereby automatically create test patterns with a high failure detection rate of the circuit.

Furthermore, while the conventional latch circuit is used for clock synchronization of memory addresses to speed up the extraction of addresses, when clock input (CK) is "L", the data input to the data input (D) is always output directly to Q, which causes addresses to be changed during a read/write operation, resulting in misoperation, the configuration according to a second aspect of the present invention inputs a signal enabling the extraction of a new address to the enable input (/EN) and can thereby prevent misoperation even if a new address is extracted when the clock input (CK) is "L" and thus speed up read/write by starting decoding of the address when the clock is "L".

Furthermore, according to the configuration according to a third aspect, the clock input (CK) or /CK, enable input (/EN) or EN is directly input to the transistor gate of the data input circuit, which minimizes the time after the clock input (CK) is driven "L" and the enable input (/EN) is driven "L" until the data input (D) is output to Q, and when this latch circuit is used for clock synchronization of memory addresses, it is possible to speed up read/write and immediately after the clock input (CK) is driven "H", data input is stopped and the Q output is held, thus preventing address extracting misoperation even if the data holding time for the clock input (CK) is short.

Furthermore, in the case where the latch circuit is used for clock synchronization of memory addresses, the configuration according to a fourth aspect of the present invention can obtain the effect according to a second aspect when the test control signal input (NT) is "L", and as a second effect, when the test control signal input (NT) is driven "H", the data input to the test input (DT) is output to the test output (QT) in synchronization with the clock input (CK), and thus a scan chain can be configured by inputting the shift data to the above described test input (DT) and connecting the test output (QT) to the shift input of another latch circuit. While the conventional art tests the address connection between the logic section and memory through an actual operation test of the entire LSI, resulting in a low circuit failure detection rate, the present invention can carry out such a test through a scan test, and can thereby automatically create a test pattern with a high circuit failure detection rate. Furthermore, as a third effect, by providing independent latch circuits for different inputs such as the 1st latch means for the data input (D) and 2nd latch means for the test input (DT) input data, the configuration according to a fourth aspect eliminates the necessity of the selection circuit according to the level of the test control signal input (NT) for the two inputs; a data input (D) and a test input (DT) for the 1st data input circuit of the 1st latch means, thus shortening the time after the clock input (CK) is driven "L" and the enable input (/EN) is driven "L" until the data input (D) is output to Q.

The configuration according to a fifth aspect constructs the row address and column address latches according to a first aspect using the latch circuit according to a fourth aspect and provides independent latch circuits for different inputs such as the 1st latch means for the address input and the 2nd latch means for the test input (DT) input data, and can thereby eliminate the necessity of the selection circuit according to the level of the test control signal input (NT) for the two inputs; an address and a test input (DT) for the 1st data input circuit of the 1st latch means, thus shortening the time after the clock is driven "L" and the enable input (/EN) is driven "L" until decoding of addresses starts.

The configuration according to a sixth aspect, when the latch circuit is used for clock synchronization of memory addresses, provides a circuit configuration sharing the data holding circuit for the data input (D) and test input (DT), and can thereby realize the same effects as the second effects according to a second and fourth aspect with fewer circuits.

While the conventional latch circuit not equipped with the scan shift input or output cannot carry out a scan test, the configuration according to a seventh aspect has such a first effect that when the test control signal input (NT) is driven "H", the data input to the test input (DT) is output to the test output (QT) in synchronization with the clock input (CK), and therefore it is possible to configure a scan chain by inputting shift data to the above described test input (DT) and connecting the test output (QT) to the shift input of another latch circuit. While the conventional art conducts a test of connection between a latch circuit and another block through an actual operation test, which results in a low circuit failure detection rate, the present invention can conduct a test of connection between a circuit block including the latch circuit of the present invention and another circuit block through a scan test, making it possible to automatically create a test pattern with a high circuit failure detection rate.

Furthermore, as a second effect, the present invention according to a seventh aspect provides independent latch means for different inputs such as one 2nd latch means for D input data and another 2nd latch means for test input (DT) input data, and can thereby eliminate the necessity of a selection circuit for the 2nd data input circuit of the first 2nd latch means according to the level of the test control signal input (NT) for two inputs; a data input (D) and a test input (DT), thus shortening the time after the clock input (CK) is driven "L" until the data input (D) is output to Q.

The configuration according to an eighth aspect of the present invention provides a circuit configuration sharing the data holding circuit for data input (D) and test input (DT), and can thereby realize the same effect as the first effect according to a seventh aspect of the present invention with fewer circuits.

The configuration according to a ninth aspect of the present invention can realize the same effect as that according to a fourth aspect of the present invention and a current reduction by fixing the test output (QT) to "L" or "H" during a normal operation when the test control signal input (NT) is "L".

The configuration according to a tenth aspect of the present invention can realize the same effect as that according to a sixth aspect of the present invention and a current reduction by fixing the test output (QT) to "L" or "H" during a normal operation when the test control signal input (NT) is "L".

The configuration according to an eleventh aspect of the present invention can realize the same effect as that according to a seventh aspect of the present invention and a current reduction by fixing the test output (QT) to "L" or "H" during a normal operation when the test control signal input (NT) is "L".

The configuration according to a twelfth aspect of the present invention can realize the same effect as that according to an eighth aspect of the present invention and a current reduction by fixing the test output (QT) to "L" or "H" during a normal operation when the test control signal input (NT) is "L".

The configuration according to a thirteenth aspect of the present invention can realize the same effect as the first and second effects according to a first aspect of the present invention and a reduction of row address latch and column address latch circuits by using the latch circuit according to a sixth aspect in the circuit configuration sharing the data holding circuit of the data input (D) and test input (DT) for the row address latch and column address latch.

The configuration according to a fourteenth aspect of the present invention can realize the same effects as the first, second and third effects according to a first aspect of the present invention by using the latch circuit according to a ninth aspect of the present invention for the row address latch and column address latch, and realize a current reduction by fixing each latch test output (QT) to "L" or "H" during a normal operation when the test control signal input (NT) is "L".

The configuration according to a fifteenth aspect of the present invention can realize the same effect as the effect according to a thirteenth aspect of the present invention by using the latch circuit according to a tenth aspect for the row address latch and column address latch, and realize a current reduction by fixing each latch test output (QT) to "L" or "H" during a normal operation when the test control signal input (NT) is "L".

The configuration according to a sixteenth aspect of the present invention can realize the same effects as the first, second and third effects according to a first aspect of the present invention, and realize a current reduction by fixing test input (DT) of the row address latch and column address latch to "L" or "H" during a normal operation when the test control signal input (NT) is "L".

The configuration according to a seventeenth aspect of the present invention can realize the same effects as the first, second and third effects according to a first aspect of the present invention, and realize a current reduction by fixing the test input (DT) of the above described row latch circuit and the above described column latch circuit which are not connected to the test outputs (QT) of the kth (k: integer 1≦k≦m) row latch circuit or the pth (p: integer 1≦p≦n) column latch circuit to "L" or "H" during a normal operation when the test control signal input (NT) is "L".

The configuration according to an eighteenth to twentieth aspect of the present invention can detect that a sense amplifier activation signal has changed a non-active level when the clock is "L" and incorporate and output row addresses, and can thereby complete decoding on the rise of the next clock cycle, shorten the operation clock cycle and speed up read/write.

The configuration according to a twenty-first aspect of the present invention can complete the latching of the above described main amplifier output during a read operation even when the clock is "L" and incorporate and output column addresses when the latch signal is driven "L" and /2nd latch enable signal is driven "L", and can thereby complete decoding on the rise of the next clock cycle, shorten the operation clock cycle and speed up read/write.

The configuration according to a twenty-second aspect of the present invention can incorporate and output column addresses during a write operation, even when the clock is "L" when the connection control signal of the transistors for connections of the bit line and main bit line reaches the level for turning OFF the transistors and when the /2nd latch enable signal is driven "L", and can thereby complete decoding on the rise of the next clock cycle, shorten the operation clock cycle and speed up read/write.

The configuration according to a twenty-third aspect of the present invention can incorporate and output column addresses by detecting that the sense amplifier activation signal has changed to a non-active level when the clock is "L", incorporate and output column addresses during a read operation even when the clock is "L" when the latching of the above described main amplifier output is completed, the latch signal is driven "L" and /2nd latch enable signal is driven "L", and incorporate and output column addresses during a write operation even when the clock is "L" and when the connection control signal of the transistors for connections of the bit line and main bit line reaches the level for turning OFF the transistors and the /2nd latch enable signal is driven "L", and can thereby complete decoding of the row addresses and column addresses on the rise of the next clock cycle of each operation, shorten the operation clock cycle and speed up read/write.

What is claimed is:

1. A semiconductor apparatus comprising a memory and logic section integrated into a single chip, wherein said logic section is for outputting m row addresses from 1st to mth address and n column addresses from 1st to nth address to said memory;

said memory comprises a memory cell array block provided with an input/output section to/from the logic section and a plurality of memory cells;

a latch connected to said logic of said input/output section is connected by a scan chain to perform a scan test to test the connection of said logic section;

said input/output section is provided with a row address input section and a column address input section;

said row address input section comprises m latch circuits from 1st to mth row latch circuit;

said column address input section comprises n latch circuits from 1st to nth column latch circuit;

each of said m latch circuits for inputting a clock to a clock input, for inputting a 1st latch enable signal output from said memory cell array block to an enable signal input, for inputting an associated one of said m row addresses to a data input, for connecting an output Q to said memory cell array block, for inputting a shift signal of said scan chain data during the scan test to a test control signal input, for inputting shift data in a preceding of said scan chain to a test input and for outputting a shift signal to a subsequent stage of said scan chain to a test output QT; and each of said n latch circuits for inputting a clock to a clock input, for inputting a 2nd latch enable signal output from said memory cell array block to an enable signal input, for inputting an associated one of said n column addresses to a data input, for connecting an output Q to said memory cell array block, for inputting a shift signal of the scan chain data during the scan test to a test control signal input, for inputting shift data in the preceding stage of said scan chain to a test input and for outputting a shift signal to the subsequent stage of said scan chain to a test output QT.

2. The semiconductor apparatus according to claim 1, wherein the row latch circuit and column latch circuit are latch circuits comprising:

five inputs of a clock input, an enable signal input, a test control data input, a data input and a test input; two outputs of an output Q and a test output; 1st latch means; 2nd latch means; and 3rd latch means, wherein said 1st latch means is constructed of a 1st data input circuit and a 1st data holding circuit, and said 1st data input circuit is fed said clock input, said enable signal input and said data input and outputs (DQ1) and when said enable signal input is active and said clock input is at the 1st logic level, outputs the inverted level of said data input to said (DQ1) and when said enable signal input is non-active or said clock input is at the 2nd logic level, holds (DQ1) at high impedance, said 1st data holding circuit comprises an inverter that is fed (A1) and outputs said output Q and a 1st output control circuit, said (A1) is connected to said (DQ1), said 1st output control circuit has three inputs; said output Q, said clock input and said enable signal input, and an output (DO1) input to said (A1) and when said enable signal input is non-active or said clock input is at the 2nd logic level, outputs the inverted level of said output Q to said (DO1) and when said enable signal input is active and said clock input is at the 1st logic level, holds said (DO1) at high impedance, said 2nd latch means is constructed of a 2nd data input circuit and a 2nd data holding circuit, has two inputs; a 2nd data input and a 2nd clock input, and an output (DQ2), and when said 2nd clock input is at the 1st logic level, outputs the inverted level of said 2nd data input to said output (DQ2) and when said 2nd clock input is at the 2nd logic level, holds said (DQ2) at high impedance, and said 2nd data holding circuit is constructed of an inverter that is fed (A2) and outputs said 2nd output Q2 and a 2nd output control circuit, said (A2) is connected to said (DQ2), said 2nd output control circuit has two inputs; said 2nd output Q2 and said 2nd clock input, and an output (DO2) input to said A2, and when said 2nd clock input is at the 2nd logic level, outputs the inverted level of said 2nd output Q2 to said (DO2), and when said 2nd clock input is at the 1st logic level, holds said 2nd output Q2 at high impedance, said 2nd data input is connected to said test input and said 2nd clock input is connected to said clock input, said 3rd latch means is constructed of a 3rd data input circuit and a 3rd data holding circuit, said 3rd data input circuit has three inputs; (B3) to which said output Q is input, (C3) to which said 2nd output Q2 is input and said test control data input and said clock input, and a 3rd output Q3, and when said clock input is at the 2nd logic level and said test control data input is non-active, outputs the inverted level of said output Q to said (DQ3), and when said test control data input (NT) is active, outputs the inverted level of said 2nd output Q2 to said (DQ3), and when said clock input is at the 1st logic level, holds said (DQ3) at high impedance, said 3rd data holding circuit is fed (A3) and outputs a 3rd output Q3, is constructed of an inverter that is fed said (A3) and outputs said 3rd output Q3, and a 3rd output control circuit, said (A3) is connected to said (DQ3), said 3rd output control circuit has two inputs; said 3rd output Q3 and said clock input and an output (DO3) input to said (A3), and when said clock input is at the 1st logic level, outputs the inverted level of said 3rd output Q3 to said (DO3), and when said clock input is at the 2nd logic level, holds said 3rd output Q3 at high impedance, and said 3rd output Q3 is connected to said test output.

3. The semiconductor apparatus according to claim 1, wherein the m latch circuits and n latch circuits are latch circuits each comprising:

five inputs of a clock input, an enable signal input, a test control data input, a data input and a test input; two outputs; an output Q; a test output; 4th latch means; and 5th latch means, wherein said 4th latch means comprises a 4th data input circuit and a 4th data holding circuit, said 4th data input circuit is for receiving said clock input, said enable signal input, said test control data input and said data input and is for outputting (DQ4), and when said test control data input is non-active, said enable signal input is active, and said clock input is at the 1st logic level, is for outputting the inverted level of said data input to said (DQ4), and when said test control data input is active and said clock input is at the 1st logic level, is for outputting the inverted level of said (DT) to said (DQ4), and when said test control data input is non-active and said enable signal input is non-active or said clock input is at the 2nd logic level, is for holding (DQ4) at high impedance, said 4th data holding circuit comprises an inverter for receiving (A4) and is for outputting said output Q and a 4th output control circuit, said (A4) is connected to said (DQ4), said 4th output control circuit comprises four comprising said output Q, said clock input, said enable signal input and said test control data input, and an output (DO4) input to said (A4), and when said test control data input is non-active and said enable signal input is non-active or said clock input is at the 2nd logic level, is for outputting the inverted level of said output Q to said (DO4) and when said test control data input is active or said enable signal input is active and said clock input is at the 1st logic level, is for holding said (DO4) at high impedance, and said 5th latch means comprises a 5th data input circuit and a 3rd data holding circuit is for receiving (A3) and is for outputting a 3rd output Q3, and further comprises an inverter for receiving said (A3) and is for outputting said 3rd output Q3, and a 3rd output control circuit, said (A3) is connected to said (DQ3), said 3rd output control circuit comprises two comprising said 3rd output Q3 and said clock input and an output (DO3) input to said (A3), and when said clock input is at the 1st logic level, is for outputting the inverted level of said 3rd output Q3 to said (DO3), and when said clock input is at the 2nd logic level, is for holding said 3rd output Q3 at high impedance, and said 3rd output Q3 is connected to said test output, and said 5th data input circuit comprises two comprising a 5th data input and a 5th clock input, and an output (DQ5), and when said 5th clock input is at the 2nd logic level, is for outputting said inverted level to said output (DQ5) and when said 5th clock input is at the 2nd logic level, is for holding said (DQ5) at high impedance, said (DQ5) is connected to said (A3) of said 3rd data holding circuit, and said 5th data input (D5) is connected to said output Q, said 5th clock input is connected to said clock input and said (DQ5) is connected to said test output.

4. The semiconductor apparatus according to claim 1, wherein the m latch circuits and n latch circuits are latch circuits each comprising:

five inputs of a clock input, an enable signal input, a test control data input, a data input and a test input; two outputs of an output Q and a test output; 1st latch means; 2nd latch means; and 3rd latch means, wherein said 1st latch means comprises a 1st data input circuit and a 1st data holding circuit, and said 1st data input circuit is for receiving said clock input, said enable signal input and said data input and is for outputting (DQ1) and when said enable signal input is active and said clock input is at the 1st logic level, is for outputting the inverted level of said data input to said (DQ1) and when said enable signal input is non-active or said clock input is at the 2nd logic level, is for holding (DQ1) at high impedance, said 1st data holding circuit comprises an inverter for receiving (A1) and is for outputting said output Q and a 1st output control circuit, said (A1) is connected to said (DQ1), said 1st output control circuit comprises three inputs comprising said output Q, said clock input and said enable signal input, and an output (DO1) input to said (A1) and when said enable signal input is non-active or said clock input is at the 2nd logic level, is for outputting the inverted level of said output Q to said (DO1) and when said enable signal input is active and said clock input is at the 1st logic level, is for holding said (DO1) at high impedance, said 2nd latch means comprises a 2nd data input circuit and a 2nd data holding circuit, comprises two inputs comprising a 2nd data input and a 2nd clock input, and an output (DQ2), and when said 2nd clock input is at the 1st logic level, is for outputting the inverted level of said 2nd data input to said output (DQ2) and when said 2nd clock input is at the 2nd logic level, is for holding said (DQ2) at high impedance, and said 2nd data holding circuit comprises an inverter for receiving (A2) and is for outputting said 2nd output Q2 and a 2nd output control circuit, said (A2) is connected to said (DQ2), said 2nd output control circuit comprises two inputs comprising said 2nd output Q2 and said 2nd clock input, and an output (DO2) input to said A2, and when said 2nd clock input is at the 2nd logic level, is for outputting the inverted level of said 2nd output Q2 to said (DO2), and when said 2nd clock input is at the 1st logic level, is for holding said 2nd output Q2 at high impedance, said 2nd data input is connected to said test input and said 2nd clock input is connected to said clock input, said 3rd latch means comprises a 3rd data input circuit and a 3rd data holding circuit, said 3rd data input circuit comprises three inputs comprising (B3) for receiving output Q as input, (C3) for receiving said 2nd output Q2 as input and said test control data input and said clock input, and a 3rd output Q3, and when said clock input is at the 2nd logic level and said test control data input is non-active, is for outputting the inverted level of said output Q to said (DQ3), and when said test control data input (NT) is active, is for outputting the inverted level of said 2nd output Q2 to said (DQ3), and when said clock input is at the 1st logic level, is for holding said (DQ3) at high impedance, said 3rd data holding circuit is for receiving (A3) and is for outputting a 3rd output Q3, comprises an inverter for receiving said (A3) and is for outputting said 3rd output Q3, and a 3rd output control circuit, said (A3) is connected to said (DQ3), said 3rd output control circuit comprises two inputs comprising said 3rd output Q3 and said clock input and an output (DO3) input to said (A3), and when said clock input is at the 1st logic level, is for outputting the inverted level of said 3rd output Q3 to said (DO3), and when said clock input is at the 2nd logic level, is for holding said 3rd output Q3 at high impedance, and said 3rd output Q3 is connected to said test output, and wherein the test output is fixed to signal level "L" or signal level "H" when the test control data input is non-active.

5. The semiconductor apparatus according to claim 1, wherein the m latch circuits and n latch circuits are latch circuits each comprising:

five inputs of a clock input, an enable signal input, a test control data input, a data input and a test input; two outputs of an output Q and a test output; 4th latch means; and 5th latch means, wherein said 4th latch means comprises a 4th data input circuit and a 4th data holding circuit, said 4th data input circuit is for receiving said clock input, said enable signal input, and said test control data input and said data input and is for outputting (DQ4), and when said test control data input is non-active, said enable signal input is active, and said clock input is at the 1st logic level, is for outputting the inverted level of said data input to said (DQ4), and when said test control data input is active and said clock input is at the 1st logic level, is for outputting the inverted level of said (DT) to said (DQ4), and when said test control data input is non-active and said enable signal input is non-active or said clock input is at the 2nd logic level, is for holding(DQ4) at high impedance, said 4th data holding circuit comprises an inverter for receiving (A4) and is for outputting said output Q and a 4th output control circuit, said(A4) is connected to said (DQ4), said 4th output control circuit comprises four inputs comprising said output Q, said clock input, said enable signal input, and said test control data input, and an output DO4 input to said (A4), and when said test control data input is non-active and said enable signal input is non-active or said clock input is at the 2nd logic level, is for outputting the inverted level of said output Q to said (DO4) and when test control data input is active or said enable signal input is active and said clock input is at the 1st logic level, is for holding said (DO4) at high impedance, said 5th latch means comprises a 5th data input circuit and a 3rd data holding circuit, said 5th data input circuit comprises two inputs comprising a 5th data input and a 5th clock input, and an output (DQ5), and when said 5th clock input is at the 2nd logic level, is for outputting the inverted level of said output (DQ5) and when said 5th clock input is at the 2nd logic level, is for holding said (DQ5) at high impedance, said (DQ5) is connected to said (A3) of said 3rd data holding circuit, and said 5th data input (D5) is connected to said output Q, said 5th clock input is connected to said clock input and said (DQ5) is connected to said test input, and wherein the test output is fixed to signal level "L" or signal level "H" when the test control data input is non-active.

6. The semiconductor apparatus according to claim 1, wherein the test input of each of said m latch circuits or said n latch circuits is fixed to signal level "L" or signal level "H" when the test control data input is non-active.

7. A DRAM comprising:
   a plurality of memory cells;
   a plurality of bit line pairs connected to their respective sense amplifiers;
   an internal row selection control signal generation circuit that generates an internal row selection control signal synchronized with a clock input based on a row selection control signal input;
   a row address latch enable signal generation circuit that generates a row address latch enable signal, which is activated when said internal row selection control signal is non-active and inactivated when said internal row selection control signal is activated;
   a row address latch circuit that is for directly outputting a row address supplied from the outside when said row address latch enable signal is active and is for holding the row address internally when said row address latch enable signal is non-active;
   a row address decoder that receives the output of said row address latch circuit and operates even if said internal row selection control signal is non-active; and
   a sense amplifier activation signal generation circuit that generates a sense amplifier activation signal that activates said sense amplifier in response to said internal row selection control signal.

8. The DRAM according to claim 7, wherein said row address latch enable signal generation circuit is for holding the non-active state of said row address latch enable signal until said sense amplifier activation signal is inactivated.

9. The DRAM according to claim 7, wherein said row address latch circuit is for operating in synchronization with said clock input and is for directly outputting the row address supplied from the outside only when said row address latch enable signal is active and said clock input is at a predetermined logic level.

10. A DRAM comprising:
    a plurality of bit lines, complementary bit lines and a plurality of main bit lines and complementary main bit lines to which a plurality of memory cells and sense amplifiers are connected;
    1st transistors for respectively connecting said bit lines and main bit lines, each of the 1st transistors having a gate coupled to receive a connection control signal;
    2nd transistors for respectively connecting said complementary lines and complementary main bit lines, each of the 2nd transistors having a gate coupled to receive a connection control signal;
    a main amplifier for amplifying a potential difference between said main bit lines and complementary main bit lines;
    a latch circuit for latching the output of said main amplifier;
    a column address latch circuit; and
    a timing generation circuit for generating a latch signal of said latch circuit, said connection control signal and /2nd latch enable signal of said column address latch circuit, a certain time after the clock edge of the clock cycle for carrying out a read operation of said memory cell,
    wherein said /2nd latch enable signal is driven "L" at timing at which said latch circuit completes the input of the output of said main amplifier and the level of said latch signal becomes the level for holding data or at timing at which said connection control signal changes from the level for turning ON said 1st transistor and 2nd transistor to the level for turning OFF said 1st transistor and 2nd transistor, whichever is later, and is driven "H" in synchronization with the clock edge of the clock cycle for carrying out the next read or write operation, and said column address latch circuit is for directly outputting the input column address when the /2nd latch enable signal is at signal level "L" and said clock is at the 1st logic level and is for holding the output signal without inputting said column address when said /2nd latch enable signal is at signal level "H" or said clock is at the 2nd logic level.

11. A DRAM comprising:
    a plurality of bit lines and complementary bit lines for respectively connecting said plurality of memory cells and sense amplifiers;
    a plurality of main bit lines and complementary main bit lines to which a write buffer outputs write data and complementary write data during an operation of writing to said memory cell;
    1st transistors for respectively connecting said bit lines and said main bit lines, each of the 1st transistors having a gate coupled to receive a connection control signal;
    2nd transistors for respectively connecting said complementary bit lines and complementary main bit lines, each of the 2nd transistors having a gate coupled to receive a connection control signal;
    a column address latch circuit; and
    a timing generation circuit for detecting said clock edge by receiving a clock as an input and for generating said connection control signal and the /2nd latch enable signal of said column address latch circuit,
    wherein the /2nd latch enable signal is driven "L" when said connection control signal changes from the level for turning ON said 1st transistor and 2nd transistor to the level for turning OFF said 1st transistor and 2nd transistor in the clock cycle of performing an operation of writing to said memory cell, and is driven "H" in synchronization with the clock edge of the clock cycle for carrying out the next read or write operation, and
    said column address latch circuit is for directly outputting the column address input when said /2nd latch enable signal is at signal level "L" and said clock is at the 1st logic level and when said /2nd latch enable signal is non-active or when said clock is at the 2nd logic level, is for holding the output signal without inputting said column address.

* * * * *